United States Patent
Saito

(10) Patent No.: US 7,625,783 B2
(45) Date of Patent: Dec. 1, 2009

(54) SEMICONDUCTOR ELEMENT AND METHOD FOR MANUFACTURING THE SAME

(75) Inventor: Satoru Saito, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 389 days.

(21) Appl. No.: 11/601,193

(22) Filed: Nov. 17, 2006

(65) Prior Publication Data
US 2007/0117406 A1 May 24, 2007

(30) Foreign Application Priority Data
Nov. 23, 2005 (JP) .............................. 2005-337912

(51) Int. Cl.
*H01L 21/00* (2006.01)
(52) U.S. Cl. .................. 438/149; 438/297; 438/439; 257/E51.005; 257/E21.545; 257/E21.552
(58) Field of Classification Search .............. 438/149, 438/297, 439, FOR. 184, FOR. 201; 257/E51.005, 257/E21.545, E21.552
See application file for complete search history.

(56) References Cited

U.S. PATENT DOCUMENTS

| | | | |
|---|---|---|---|
| 5,663,077 A | | 9/1997 | Adachi et al. |
| 5,677,234 A | * | 10/1997 | Koo et al. .................. 438/439 |
| 5,716,871 A | * | 2/1998 | Yamazaki et al. ........... 438/635 |
| 5,726,082 A | * | 3/1998 | Park et al. .................... 438/165 |
| 5,966,594 A | | 10/1999 | Adachi et al. |
| 6,010,924 A | * | 1/2000 | Takemura et al. ........... 438/164 |
| 6,210,997 B1 | | 4/2001 | Adachi et al. |
| 6,465,284 B1 | | 10/2002 | Adachi et al. |
| 2004/0217431 A1 | | 11/2004 | Shimada |

FOREIGN PATENT DOCUMENTS

| | | |
|---|---|---|
| JP | 07-094756 | 4/1995 |
| JP | 2004-319952 | 11/2004 |

\* cited by examiner

*Primary Examiner*—Michelle Estrada
(74) *Attorney, Agent, or Firm*—Cook Alex Ltd.

(57) ABSTRACT

A method by which generation of leak current can be suppressed and also a fine element can be formed by performing element isolation at a temperature at which a glass substrate can be used is provided. The method includes a first step of forming a base film over a glass substrate; a second step of forming a semiconductor film over the base film; a third step of forming, over the semiconductor film, a film preventing oxidation or nitridation of the semiconductor film into a predetermined pattern; and a fourth step of performing element isolation by radical oxidation or radical nitridation of a region of the semiconductor film, which is not covered with the predetermined pattern, at a temperature of the glass substrate lower than a strain point thereof by 100° C. or more, where radical oxidation or radical nitridation is performed over a semiconductor film placed apart from a plasma generation region, in a plasma treatment chamber with an electron temperature within the range of 0.5 to 1.5 eV, preferably less than or equal to 1.0 eV, and an electron density within the range of $1 \times 10^{11} \text{cm}^{-3}$ to $1 \times 10^{13} \text{cm}^{-3}$.

2 Claims, 13 Drawing Sheets

401  402  403

404

405                                    405

406

SEMICONDUCTOR ELEMENT AND METHOD FOR MANUFACTURING THE SAME

BACKGROUND OF THE INVENTION

1. Field of the Invention

The invention disclosed in this specification relates to element isolation of a semiconductor element used for a semiconductor device. In addition, the invention relates to a semiconductor element formed by element isolation.

2. Description of the Related Art

A thin film transistor, which is one kind of semiconductor element, is generally referred to as a TFT and is widely known as a switching element used for an active matrix display device. Conventionally, in order to perform element isolation during a manufacturing process of a semiconductor element such as a thin film transistor, the following methods have been employed: a method of isolating a semiconductor film into an island-shaped pattern by patterning and etching (hereinafter, referred to as a photolithography method), a method of directly forming an island-shaped pattern by a droplet discharging method, a method of selectively forming an oxide film for element isolation by thermal oxidation, which is referred to as LOCOS (local oxidation of silicon) (hereinafter, referred to as a LOCOS method), or the like.

However, in a case of a droplet discharging method, there is a problem in that miniaturization of an element is difficult in comparison with a LOCOS method. In a case of a photolithography method, there is a problem that, when an island-shaped pattern having a side surface which is almost perpendicular (90°±10°) to a surface of a base film formed over a substrate is formed, not only a semiconductor film but also the base film is etched, and accordingly, a corner portion (edge portion) of the formed island-shaped pattern becomes a peak shape as shown in FIG. 5A of Patent Document 1 (Japanese Published Patent Application No. H7-094756).

Even if an island-shaped pattern can be formed without formation of a peak shape, the base film is etched by cleaning the formed island-shaped pattern with hydrofluoric acid. Accordingly, a corner portion of the island-shaped pattern becomes a peak shape. Cleaning with hydrofluoric acid is a cleaning method which is often performed during a manufacturing process of a semiconductor element in order to remove a natural oxide film formed over a surface of silicon and in order to obtain a clean surface.

When a gate insulating film is formed covering the island-shaped pattern by a CVD method after the peak shape is formed as described above, there are problems in that a thickness of the formed gate insulating film is not uniform and a thin portion is generated, a crack is generated, and the like, as shown in FIG. 5B of Patent Document 1. It is considered that the problems become noticeable when an attempt to make the thickness of the gate insulating film thin and uniform is made and cause leak current through the gate insulating film. In the invention described in Patent Document 1, in order to solve the problems, after a peak shape is formed, a thin oxide film is formed over a surface of an island-shaped pattern by emitting infrared light or a laser in an oxygen atmosphere or by heating in an oxygen atmosphere, and furthermore, an insulating film is formed by a CVD method or the like. In this case, however, because the problem of the formation of the peak shape cannot be solved, there are problems in that forming the gate insulating film thinly and uniformly is difficult and that the number of steps for forming the gate insulating film is increased.

In order to perform element isolation without formation of an island-shaped pattern by a LOCOS method, it is necessary to oxidize silicon at a high temperature of approximately 1000° C. in an oxygen atmosphere. Therefore, a substrate which cannot withstand a high temperature of 1000° C., such as a plastic substrate or a glass substrate typified by a nonalkali glass substrate, cannot be employed as a substrate to be used. Although a quartz substrate (also referred to as a silica glass substrate) which can withstand a temperature of 1000° C. is sold, such a quartz substrate is more expensive than the glass substrate.

In recent years, a method of forming a gate insulating film of a semiconductor element by using a high-density plasma treatment apparatus has attracted attention. For example, in Patent Document 2 (Japanese Published Patent Application No. 2004-319952), forming a silicon nitride layer which becomes a gate insulating film over a semiconductor layer by directly reacting nitrogen activated by plasma excitation with the semiconductor layer of an SOI (silicon on insulator) substrate is disclosed. In addition, in Patent Document 2, the semiconductor layer of the SOI substrate is isolated in each element formation region. However, as an isolation method, only formation of a trench in the semiconductor layer by a dry etching method or formation of an element isolation region by an STI (shallow trench isolation) method or the like is described.

SUMMARY OF THE INVENTION

It is an object of the invention disclosed in this specification to manufacture a semiconductor element in which generation of leak current through a gate insulating film is suppressed by a method which is easier than a conventional method during a manufacturing process of the semiconductor element used for a semiconductor device. Moreover, it is another object of the invention to provide an element isolation method capable of miniaturing an element to be as fine as or finer than an element in a case of element isolation by a LOCOS method, without the necessity of high-temperature heat treatment in which a glass substrate cannot be used.

When element isolation is performed, a semiconductor film is selectively oxidized by using a high-density plasma treatment apparatus, and accordingly, an oxide film for element isolation is selectively formed over the semiconductor film. A nitride film may be selectively formed by a high-density plasma treatment apparatus instead of forming the oxide film. The high-density plasma treatment apparatus for forming an oxide film and a nitride film can excite a plasma in a chamber by using a microwave without using a magnetic field and, at the same time, can achieve an electron temperature of less than or equal to 1.5 eV and an electron density of greater than or equal to $1\times10^{11}$ cm$^{-3}$ on an object to be processed. Therefore, because a high-density plasma can be generated at a low electron temperature, damage to an element can be reduced.

Plasma is an ionized gas, electrically neutral as a whole, in which the amount of electrons with negative charge is equal to the amount of ions with positive charge. An electron density or an ion density included per unit volume of the plasma is referred to as a plasma density. In the invention disclosed in this specification, a plasma density indicates an electron density. In addition, an electrically neutral radical, for example, an oxygen radical, is generated in the plasma, and the radical affects an object to be processed by plasma treatment. Therefore, oxidation and nitridation by a high-density plasma treatment apparatus are sometimes referred to as radical oxidation and radical nitridation, respectively.

The invention disclosed in this specification is a manufacturing method of a semiconductor element, which includes a first step of forming a base film over a glass substrate; a second step of forming a semiconductor film over the base film; a third step of forming, over the semiconductor film, a film for preventing oxidation or nitridation of the semiconductor film into a predetermined pattern; and a fourth step of performing element isolation by radical oxidation or radical nitridation of a region of the semiconductor film, which is not covered with the predetermined pattern, at a temperature of the glass substrate lower than the strain point of the glass substrate by 100° C. or more.

The film for preventing oxidation or nitridation which is formed into the predetermined pattern in the third step may be a gate insulating film.

Another invention disclosed in this specification is a manufacturing method of a semiconductor element, which includes a first step of forming a base film over a glass substrate; a second step of forming a semiconductor film over the base film; a third step of forming an oxide film or a nitride film over the surface of the semiconductor film by radical oxidation or radical nitridation of the semiconductor film, at a temperature of the glass substrate lower than the strain point of the glass substrate by 100° C. or more; a fourth step of forming, over the oxide film or the nitride film, a film for preventing oxidation or nitridation of the semiconductor film; a fifth step of forming the oxide film or the nitride film and the film for preventing oxidation or nirtidation into a predetermined pattern; and a sixth step of performing element isolation by radical oxidation or radical nitridation of a region of the semiconductor film, which is not covered with the predetermined pattern, at a temperature of the glass substrate lower than the strain point of the glass substrate by 100° C. or more.

The oxide film or the nitride film formed into the predetermined pattern in the fifth step may be used as a gate insulating film, and furthermore, a gate electrode may be formed by using the film for preventing oxidation or nitridation which is formed into the predetermined pattern in the fifth step.

Another invention disclosed in this specification is a manufacturing method of a semiconductor element, which includes a first step of forming a gate electrode over a glass substrate; a second step of forming a gate insulating film over the gate electrode; a third step of forming, over the semiconductor film, a semiconductor film over the gate insulating film; a fourth step of forming a film for preventing oxidation or nitridation of the semiconductor film into a predetermined pattern so as to overlap with the gate electrode; a fifth step of performing element isolation by radical oxidation or radical nitridation of a region of the semiconductor film, which is not covered with the predetermined pattern, at a temperature of the glass substrate lower than the strain point of the glass substrate by 100° C. or more; and a sixth step of removing the film for preventing oxidation or nitridation which is formed into the predetermined pattern.

The radical oxidation or the radical nitridation is performed over a semiconductor film (especially over the surface of or in a vicinity of the surface of the semiconductor film) placed apart from a plasma generation region, in a plasma treatment chamber with an electron temperature of greater than or equal to 0.5 eV and less than or equal to 1.5 eV, preferably less than or equal to 1.0 eV, and an electron density of greater than or equal to $1\times10^{11}$ cm$^{-3}$ and less than or equal to $1\times10^{13}$ cm$^{-3}$. The range of the electron temperature and the electron density is a condition where plasma damage to the semiconductor film can be reduced and also both radical oxidation and radical nitridation can be performed without fail. When radical oxidation or radical nirtidation for performing element isolation is performed, it is not necessary to completely oxidize or nitride the semiconductor film from an upper surface to a lower surface if elements next to each other can be electrically separated.

A temperature of the glass substrate is set lower than the strain point of the glass substrate by 100° C. or more in consideration of a heat resistance property of the glass substrate. When a glass substrate having a strain point greater than or equal to 650° C. is used, a temperature of the glass substrate may be set less than or equal to 550° C., for example, 400° C. A strain point of a glass substrate used for forming a semiconductor element, especially a thin film transistor, is generally 500 to 700° C. Therefore, the glass substrate is not affected by the 400° C. temperature, a temperature at which it is not necessary to consider a problem such as deformation. The lower limit of the temperature of the glass substrate is 200° C. in order that an oxide film or a nitride film be formed with desired film quality and thickness.

A flexible substrate, for example, a plastic substrate, can be used instead of a glass substrate. In a case of the invention disclosed in this specification, it is preferable to use a heat resistant plastic substrate having a glass transition point greater than or equal to 200° C. In performing radical oxidation and radical nitridation, the temperature of the plastic substrate has to be set to a temperature less than or equal to the glass transition point of the substrate. It is to be noted that, when plastic is heated to a temperature less than or equal to a given temperature, the movement of a molecule is limited and a property of a solid glass state is shown, and when the plastic is heated to a temperature greater than or equal to the given temperature, the molecule easily moves and a property of a soft rubber state is shown. This given temperature is the glass transition point.

The above oxidation preventing film or nitridation preventing film protects a portion of a semiconductor film which is covered with the film from being oxidized by radical oxidation or nitrided by radical nitridation. For example, a tungsten film can be used as such a film. A film of another metal such as titanium may be used instead of tungsten. An insulating film may be used other than a conductive film such as a metal film. The oxidation preventing film or nirtidation preventing film is formed into a predetermined pattern by the combination of a photolithography method and a CVD method or a sputtering method. The predetermined pattern can be directly formed by a droplet discharging method such as an ink jet method or a printing method such as a screen printing method.

The semiconductor film may be in any of an amorphous state, a polycrystalline state, or a single crystalline state. In addition, as the semiconductor film, for example, a silicon film in any of the above crystalline states, a film containing silicon and germanium, or a film containing both amorphous silicon and crystalline silicon can be used as the semiconductor film.

The invention disclosed in this specification makes it possible to perform element isolation at a temperature which does not affect a glass substrate or a plastic substrate, without formation of an island-shaped pattern or a groove (trench). Through the element isolation, the element can be miniaturized to be as fine as or finer than an element in a case of a conventional LOCOS method. Since a peak shape is not formed in a formed semiconductor element as in a case where an island-shaped pattern is formed, leak current can be reduced.

DETAILED DESCRIPTION OF THE INVENTION

In embodiment modes hereinafter described, examples in which element isolation is performed with the use of a high-density plasma treatment apparatus in manufacturing a thin film transistor as a semiconductor element will be shown. The embodiment modes can be combined appropriately for implementation.

EMBODIMENT MODE 1

Figure 1A:
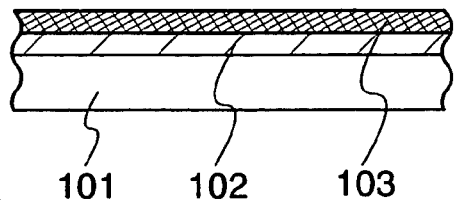
FIGS. 1A to 1F are cross-sectional views each showing a manufacturing process of a thin film transistor in Embodiment Mode 1.

As shown in FIG. 1A, a base film 102 is formed over a glass substrate 101. A heat-resistant plastic substrate can be used instead of the glass substrate. Other substrates may also be used as long as the substrates can withstand a temperature greater than or equal to 200° C. during plasma treatment. The base film 102 can be one-layer or multilayer. In this embodiment mode, a silicon nitride film and a $SiO_xN_y$ film (x, y>0) thereover are formed continuously by a CVD method or the like. A silicon nitride film containing oxygen may be used as a silicon nitride film in order to increase adhesion with the glass substrate 101 or the like. Hereinafter, as in a silicon nitride film described in this specification, the silicon nitride film may contain oxygen.

The base film 102 is formed in order to prevent an impurity from dispersing from the glass substrate 101 into a semiconductor film which is formed later. Therefore, because a silicon oxide film is not enough to achieve this object, it is necessary to form a silicon nitride film or a $SiO_xN_y$ film which is more highly effective for preventing impurity dispersion than a silicon oxide film. In addition, the $SiO_xN_y$ film is superior to the silicon nitride film in adhesion.

A semiconductor film 103 is formed over an entire surface of the base film 102 to have a thickness of greater than or equal to 10 nm and less than or equal to 70 nm. Although it is desirable to form the semiconductor film 103 to have a thickness of less than or equal to 20 nm when radical oxidation or radical nitridation which is later performed on the semiconductor film 103 is considered, the semiconductor film 103 may be formed to have a thickness of more than 20 nm as long as element isolation can be performed by radical oxidation or radical nitridation. In this embodiment, as the semiconductor film 103, an amorphous silicon film is formed by a CVD method. The amorphous silicon film formed by a CVD method contains hydrogen derived from a material gas.

Thereafter, according to need, the amorphous silicon film is crystallized by a method described below and a polycrystalline silicon film is formed. One method of crystallization is a method by which, after a layer containing an element such as nickel that promotes crystallization of amorphous silicon is formed over a portion or an entire surface of the amorphous silicon film, the amorphous silicon film is crystallized by heating at a temperature lower than a strain point of a glass substrate by 100° C. or more (for example, at 550° C.) for a predetermined length of time (for example, for 4 hours). The other method is a method by which the entire surface of the amorphous silicon film is irradiated with a processed laser through an optical system so that a cross section becomes linear, oval, or oblong and the amorphous silicon film is crystallized. These two methods can be combined. The amorphous silicon film may be crystallized by RTA (rapid thermal anneal) instead of by laser irradiation. When a plastic substrate is used, the amorphous silicon film is crystallized by laser irradiation or RTA.

As a laser which can be used for the above crystallization method, a continuous oscillation laser or a pulsed oscillation laser can be used. Specifically, an oscillating laser from one or more of a gas laser such as an Ar ion laser, a Kr ion laser, an excimer laser, a copper vapor laser, a metal vapor laser; a laser using, as a medium, single crystalline YAG, $YVO_4$, $Mg_2SiO_4$, $YAlO_3$, or $GdVO_4$ doped with one or more of Nd, Yb, Cr, Ti, Ho, Er, Tm, and Ta as a dopant; a laser using, as a medium, polycrystalline YAG, $Y_2O_3$, $YVO_4$, $YAlO_3$, or $GdVO_4$ doped with one or more of Nd, Yb, Cr, Ti, Ho, Er, Tm, and Ta as a dopant; and a solid laser such as a glass laser, a ruby laser, an alexandrite laser, or a Ti:sapphire laser can be used. A crystal having a large grain diameter can be obtained by emitting the fundamental wave of the above laser and the second harmonic, the third harmonic, or the fourth harmonic of the fundamental wave. For example, the second harmonic (532 nm) or the third harmonic (355 nm) of an Nd:$YVO_4$ laser can be used, and the laser is capable of both continuous oscillation and pulsed oscillation. In the case of continuous oscillation, the amorphous silicon film is irradiated with a laser having a power density of 0.01 to 100 $MW/cm^2$, preferably 0.1 to 10 $MW/cm^2$, at a scanning speed of 10 to 2000 cm/sec.

A laser using, as a medium, single crystalline YAG, $YVO_4$, $Mg_2SiO_4$, $YAlO_3$, or $GdVO_4$ doped with one or more of Nd, Yb, Cr, Ti, Ho, Er, Tm, and Ta as a dopant; a laser using, as a medium, polycrystalline YAG, $Y_2O_3$, $YVO_4$, $YAlO_3$, or $GdVO_4$ doped with one or more of Nd, Yb, Cr, Ti, Ho, Er, Tm, and Ta as a dopant; an Ar ion laser; and a Ti:sapphire laser are each capable of both continuous oscillation and pulsed oscillation, and pulsed oscillation at an oscillation frequency of greater than or equal to 10 MHz is possible. When a laser beam is oscillated at a repetition rate of greater than or equal to 10 MHz, the amorphous silicon film is irradiated with the next pulse after melting of the amorphous silicon film by being irradiated with a previous pulse and before solidification thereof. Therefore, a crystal grain which is continuously grown in a scanning direction of the laser can be obtained, which differs from the case of using a pulsed oscillation laser having an oscillation frequency of much lower than 10 MHz.

When the amorphous silicon film contains hydrogen, it is desirable to perform heating treatment before crystallization by laser irradiation in order to discharge hydrogen from the amorphous silicon film. After the crystallization, the entire surface of the obtained polycrystalline silicon film may be doped with an impurity such as boron imparting one conductivity type for the purpose of channel doping. In addition, the thickness of the polycrystalline silicon film after crystallization tends to be slightly thinner than that of the first amorphous silicon film.

Figure 1B:
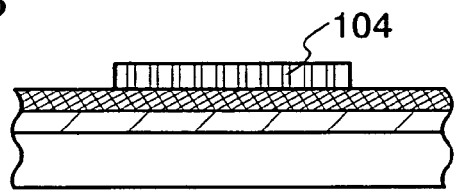

As shown in FIG. 1B, a film 104 for preventing oxidation of the semiconductor film is formed into a predetermined pattern. In this embodiment mode, a tungsten film is formed over the entire surface of the semiconductor film 103 by a sputtering method or the like, and thereafter, formed into a predetermined pattern by a photolithography method. The tungsten film has a feature that an oxide film is not formed over the surface thereof through the selection of a treatment condition when performing radical oxidation later. The oxidation preventing film 104 may be formed of materials other than tungsten as long as the film can prevent radical oxidation of the semiconductor film 103. In addition, the predetermined pattern of the oxidation preventing film 104 may be directly formed by a droplet discharging method (ink jet method), a screen printing method, or the like. By making a thickness of the oxidation preventing film 104 as thick as or thicker than that of the semiconductor film 103, the radical oxidation of the semiconductor film 103 can be prevented without fail.

When radical nitridation, not radical oxidation, is performed instead of radical oxidation, a film which can prevent radical nitridation of the semiconductor film 103 has to be formed instead of the oxidation preventing film 104. In the same manner, when both radical oxidation and radical nitridation are performed, a film which can prevent radical oxidation and radical nitridation of the semiconductor film 103 has to be formed.

Figure 2A:
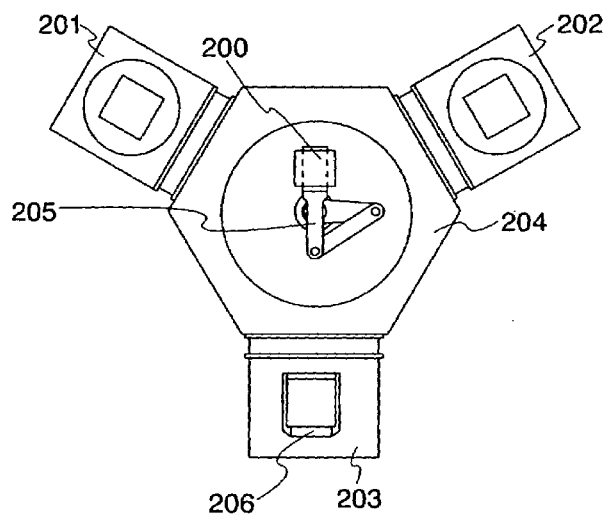
FIGS. 2A and 2B are a view of a high-density plasma treatment apparatus and a cross-sectional view of a high-density plasma treatment chamber, respectively.
Figure 2B:
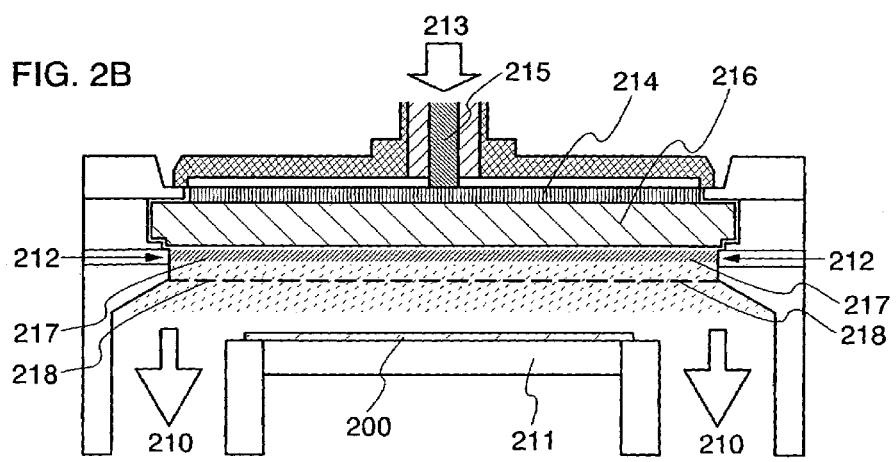

Radical oxidation is performed on the semiconductor film 103 by using a high-density plasma treatment apparatus shown in FIGS. 2A and 2B. The high-density plasma treatment apparatus shown in FIGS. 2A and 2B is an example, and the structure of the high-density plasma treatment apparatus is not limited to the structure shown in the drawings.

The high-density plasma treatment apparatus shown in FIG. 2A has a multi-chamber structure, which is provided with at least a first plasma treatment chamber 201, a second plasma treatment chamber 202, a load lock chamber 203, and a common chamber 204. The first plasma treatment chamber 201 is a chamber for performing radical oxidation, and the second plasma treatment chamber 202 is a chamber for performing radical nitridation. Each of the chambers shown in FIG. 2A is evacuated, and radical oxidation and radical nitridation can be performed consecutively without exposing a substrate to be processed 200 to the air. In this embodiment mode, the glass substrate 101 over which the base film 102, the semiconductor film 103, and the oxidation preventing film 104 formed into a predetermined pattern are formed corresponds to the substrate to be processed 200.

It is desirable that the high-density plasma treatment apparatus be provided with a chamber capable of performing treatment other than radical oxidation and radical nitridation, such as a CVD chamber, a sputtering chamber, a dry etching chamber, an ion doping chamber, or a heat treatment chamber. Accordingly, a thin film transistor can be manufactured by a smaller number of apparatuses than ever before, thereby improving manufacturing efficiency and reducing manufacturing costs.

A robot arm 205 is set in the common chamber 204. A cassette 206 in which a plurality of the substrates to be processed 200 is held is set in the load lock chamber 203. The substrate to be processed 200 held in the cassette 206 can be carried to the first plasma treatment chamber 201 or the second plasma treatment chamber 202 through the common chamber 204 by the robot arm 205. In addition, the substrate to be processed 200 can be carried from the first plasma treatment chamber 201 to the second plasma treatment chamber 202 through the common chamber 204, or vice versa, the substrate to be processed 200 can be carried from the second plasma treatment chamber 202 to the first plasma treatment chamber 201 through the common chamber 204.

FIG. 2B shows a structure which is common to the first plasma treatment chamber 201 and the second plasma treatment chamber 202. A vacuum pump (not shown) capable of reducing the pressure to a predetermined pressure is connected to the plasma treatment chamber, and the air is discharged from an exhaust port 210. Also, a substrate holder 211 is provided in the plasma treatment chamber, and the substrate to be processed 200 to which radical oxidation or radical nitridation is performed is held on the substrate holder 211. This substrate holder 211 is provided with a heater so that the substrate to be processed 200 can be heated.

A gas such as oxygen, nitrogen, hydrogen, ammonia, or a rare gas is introduced into the plasma treatment chamber through a gas introduction port as shown by an arrow 212. A microwave 213 for plasma excitation is introduced through a waveguide 215 provided over an antenna 214. The antenna 214 includes a portion for generating an electric field for plasma excitation, a slot, and a slow wave plate. The shape of the slot is like a plate formed with a plurality of elongated holes, for example, a discoidal shape.

A plasma is generated in a region 217, indicated by diagonal lines, directly under a dielectric plate 216, and is supplied over the substrate to be processed 200 through a shower plate 218 with multiple holes. The generated plasma may be supplied over the substrate to be processed 200 without providing the shower plate 218. The substrate to be processed 200 is placed apart from the region 217 in which the plasma is generated. The plasma obtained in the plasma treatment chamber has an electron temperature of less than or equal to 1.5 eV and an electron density of greater than or equal to $1 \times 10^{11}$ cm$^{-3}$, that is, achieves a low electron temperature and a high electron density, and has a plasma potential of greater than or equal to 0 V and less than or equal to 5 V. Such plasma parameters can be measured by a probe measuring method such as a double probe method.

An electron cyclotron resonance (ECR) plasma CVD device has been conventionally known as a device capable of generating a high electron density plasma. In the ECR plasma CVD device, providing a magnet for generating a magnetic field around the plasma treatment chamber is necessary. On the other hand, in the high-density plasma treatment apparatus, because a magnetic field is not used in generating the plasma, it is not necessary to provide a magnet.

In this embodiment mode, argon, hydrogen, and oxygen are adjusted to a predetermined flow ratio, e.g., Ar/H$_2$/O$_2$=500 sccm:10 sccm:5 sccm, to be introduced into the first plasma treatment chamber 201, and a microwave with a frequency of 2.45 GHz is used; accordingly, a plasma is generated. Other inert gasses may be introduced thereinto instead of argon. The pressure in the first plasma treatment chamber 201 is set to be an optimal value within the range of 5 to 500 Pa, e.g., 133.33 Pa. The glass substrate 101 over which the base film 102, the semiconductor film 103, and the oxidation preventing film 104 formed into a predetermined pattern are formed is placed on the substrate holder 211 in the first plasma treatment chamber 201, and the temperature of the glass substrate 101 is kept at 400° C. When a heat-resistant plastic substrate is used, the temperature is kept at lower than a glass transition point of the substrate, however, over 200° C. Then, radical oxidation is performed on a region of the semiconductor film 103 which is not covered with the oxidation preventing film 104 formed into a predetermined pattern.

When the oxidation preventing film 104 is a tungsten film and a flow ratio of hydrogen and oxygen $H_2/O_2$ among argon, hydrogen, and oxygen is set to be greater than or equal to 2, there is a feature that the tungsten film is not oxidized but the semiconductor film 103 is oxidized. It is estimated that this is because, although tungsten oxide is formed once by reaction of the tungsten film with oxygen radical, the tungsten oxide is reduced to tungsten by reaction with hydrogen radical. According to this estimation, even a natural oxide film formed over the surface of the tungsten film is removed by hydrogen radical by being exposed to the air. When the flow ratio of hydrogen and oxygen, $H_2/O_2$, is set to be greater than or equal to 2, oxidation of the semiconductor film 103 is suppressed; therefore, it is desirable that the flow ratio of hydrogen and oxygen, $H_2/O_2$, be set to be less than or equal to 4. As described above, if the tungsten film is used as the oxidation preventing film 104, the semiconductor film 103 only can be selectively oxidized by radical oxidation.

Figure 1C:
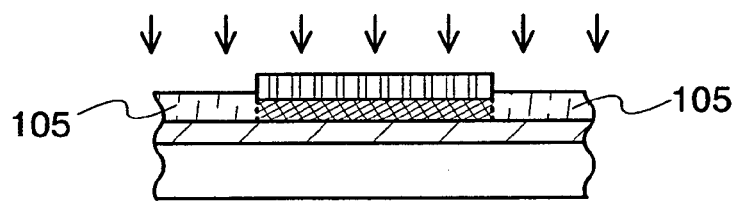

By the above radical oxidation, as shown in FIG. 1C, an oxide film 105 is formed as an insulating film which isolates elements next to each other. When radical nitridation is performed, a nitride film is formed instead of the oxide film 105. Although it is desirable that the region of the semiconductor film 103 which is not covered with the oxidation preventing film 104 formed into the predetermined pattern be completely oxidized in order to completely isolate the elements, the semiconductor film 103 in the region need not be completely oxidized from an upper surface to a lower surface (a surface which is in contact with the base film 102) as long as the elements next to each other are electrically insulated. For example, a case where the semiconductor film 103 imparts a conductivity type opposite to that of a high concentration impurity region which is formed later corresponds to this. When a thickness of the semiconductor film 103 is less than or equal to 10 nm, the semiconductor film 103 is easily oxidized from the upper surface to the lower surface. However, when the thickness of the semiconductor film 103 is over 20 nm, it is difficult to completely oxidized the semiconductor film 103 from the upper surface to the lower surface by radical oxidation.

Since an electron temperature of a plasma over the semiconductor film 103 is less than or equal to 1.5 eV and an electron density thereof is greater than or equal to $1 \times 10^{11}$ $cm^{-3}$, and furthermore, since the semiconductor film 103 and a region where the plasma is generated 217 shown in FIG. 2B are away from each other, plasma damage to the oxide film 105 obtained by radical oxidation is suppressed. By using a microwave with a frequency of 2.45 GHz in order to generate the plasma, a low electron temperature and a high electron density can be realized more easily than in a case where a microwave with a frequency of 13.56 MHz is used. If the low electron temperature and the high electron density can be obtained, the microwave is not limited to the microwave with a frequency of 2.45 GHz.

Figure 1D:
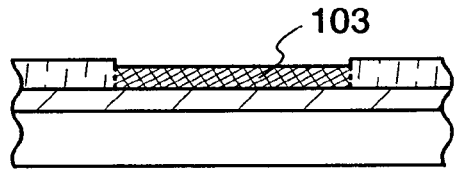

Thereafter, as shown in FIG. 1D, the oxidation preventing film 104 formed into a predetermined pattern is removed. Since the tungsten film is used as the oxidation preventing film 104 in this embodiment mode, the oxidation preventing film 104 is removed by wet etching with ammonia-peroxide mixture. On condition that the oxide film 105 is not removed with removal of the tungsten film, an etchant other than the above etchant may also be used and dry etching may be performed without being limited to wet ething. By using a tungsten film where an oxide film is not formed over the surface thereof by radical oxidation as the oxidation preventing film 104, removing only the oxidation preventing film 104, without removing the oxide film 105, becomes easy.

Figure 1E:
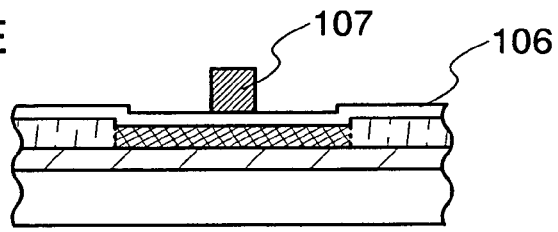

Next, a gate insulating film 106 is formed in a region where the oxidation preventing film 104 is removed. The gate insulating film 106 is formed of a silicon oxide film, a silicon nitride film, or $SiO_xN_y$ film (x, y>0). As shown in FIG. 1E, the gate insulating film 106 may be formed not only in the region where the oxidation preventing film 104 is removed, that is, the region where the oxide film 105 is not formed over the semiconductor film 103, but also over the oxide film 105. The gate insulating film 106 may be formed by radical oxidation of the semiconductor film 103. When the semiconductor film 103 remains intact under the oxide film 105 after radical oxidation, oxygen radicals diffuse in the oxide film 105 in performing radical oxidation of the semiconductor film 103; accordingly, oxidation of an interface between the oxide film 105 and the semiconductor film 103 can be made to progress. The gate insulating film 106 may be formed by radical nitridation instead of radical oxidation.

A peak shape which has been conventionally formed is not formed even if the semiconductor film 103 is cleaned with hydrofluoric acid before forming the gate insulating film 106 by a CVD method or the like. This is because the semiconductor film 103 is not formed into an island-shaped pattern and because the oxide film 105 exists. In addition, by controlling the time for cleaning with hydrofluoric acid, the oxide film 105 which is slightly thicker than the semiconductor film 103 in which the oxidation preventing film 104 is removed can be planarized to be as thick as the semiconductor film 103.

Figure 5A:
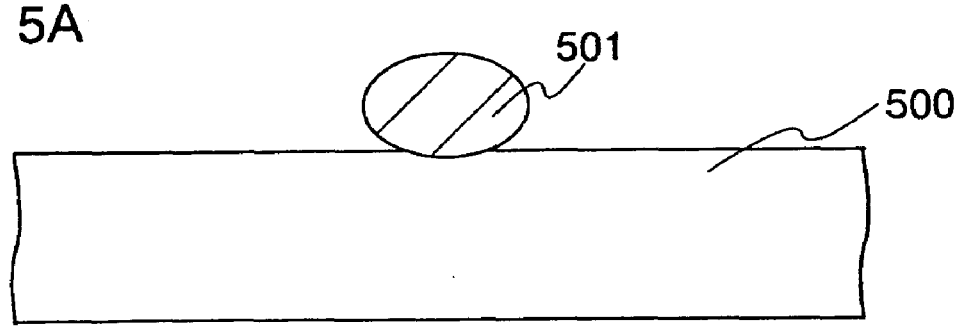
FIGS. 5A and 5B are cross-sectional views each showing plasma treatment of an insulating film to which dust is attached.

There is a case where dust is attached to a film formed by a CVD method or a sputtering method. Although various shapes of dust can be considered, a state where granular dust 501 formed from an inorganic substance is attached to a surface of an insulating film 500 which is formed by a CVD method or a sputtering method is shown in FIG. 5A. A case where radical oxidation or radical nitridation is performed, by using the high-density plasma treatment apparatus shown in FIGS. 2A and 2B, on the insulating film 500 to which the dust 501 is attached is considered. It is to be noted that the above-described dust is also called a particle, and a film formed by a CVD method, a sputtering method, or the like is required to have as few particles as possible.

Figure 5B:
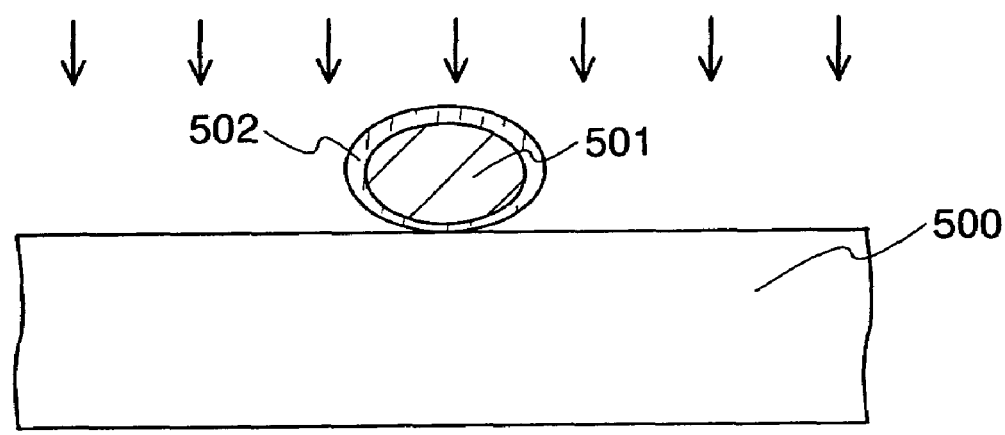

A surface portion 502 of the dust 501 is oxidized or nitrided by radical oxidation or radical nitridation as shown in FIG. 5B, and the volume of the dust 501 is increased. In addition, when the insulating film 500 is formed of a silicon oxide film, by radical nitridation, nitridation reaches a portion of the insulating film 500 under the dust 501 as well as a portion in which there is no dust.

At this time, the dust 501 is in a state of being easily removed from the surface of the insulating film 500 by a simple cleaning such as by brush cleaning or by megasonic cleaning. As described above, even nano level dust becomes easily removable by plasma treatment. The same can be said not only for this embodiment mode but also for other embodiment modes when plasma treatment is performed on a film (not limited to the gate insulating film) to which dust (a particle) is attached.

Although the above explanation is applied to a case where the dust (particle) is formed of an inorganic substance, in a case where the dust is formed of an organic substance, ashing is performed by radical oxidation and the dust (particle) is removed without performing separate cleaning.

Next, a gate electrode 107 is formed over the gate insulating film 106. The gate electrode 107 can be a single layer or a stacked layer of two or more layers, and may be formed into a tapered shape. Then, the semiconductor film 103 is doped with an impurity imparting N-type such as phosphorus.

A sidewall 108 formed of an insulating substance is formed on the side of the gate electrode 107, according to need. An insulating film is formed covering the gate insulating film 106 and the gate electrode 107, and the insulating film is anisotropically etched, thereby forming the sidewall 108. When the gate insulating film 106 is also etched during the anisotropic etching, the gate insulating film 106 may remain intact under the gate electrode 107 and the sidewall 108, at least.

The semiconductor film 103 is doped with an impurity imparting N-type such as phosphorus at a higher dose amount than that of the previous doping by using the gate electrode 107 and the sidewall 108 as masks; accordingly, high concentration impurity regions 109, that is, a source region and a drain region, are formed to adjoin the oxide film 105 (the insulating film which isolates the elements next to each other). A portion under the sidewall 108 becomes a low concentration impurity region 110 (also referred to as an LDD region) which adjoins the high concentration impurity region 109. In addition, a region interposed by a pair of low concentration impurity regions 110 is a channel formation region. Then, the added impurity is activated. Alternatively, when the low concentration impurity region 110 and the high concentration impurity region 109 are formed, an impurity imparting P-type such as boron may be added instead of an impurity imparting N-type.

Thereafter, a protective film 111 is formed covering the gate electrode 107 or the like. Furthermore, an interlayer insulating film 112 is formed over the protective film 111 by a CVD method. The protective film 111 and the interlayer insulating film 112 may be described as a first interlayer insulating film and a second interlayer insulating film, respectively. Then, a contact hole exposing part of the high concentration impurity region 109 is formed by performing dry etching of the protective film 111 and the interlayer insulating film 112, and a wiring 113 and the high concentration impurity region 109 are electrically connected to each other through the contact hole.

The wiring 113 may be a stacked layer of two or more layers. For example, the wiring 113 is formed by continuously forming three layers of a first titanium film, an aluminum film, and a second titanium film by a sputtering method. Moreover, the first titanium film may be nitrided by radical nitridation and a titanium nitride layer may be formed over the surface of the first titanium film. It is preferable to consecutively perform formation of the first titanium film, plasma nitridation, formation of the aluminum film, and formation of the second titanium film without exposure to the air. Instead of the first and second titanium films, films containing metal that has a higher melting point than aluminum, such as chromium, molybdenum, or tungsten, as the main component may be formed so as to sandwich the aluminum film.

Figure 1F:
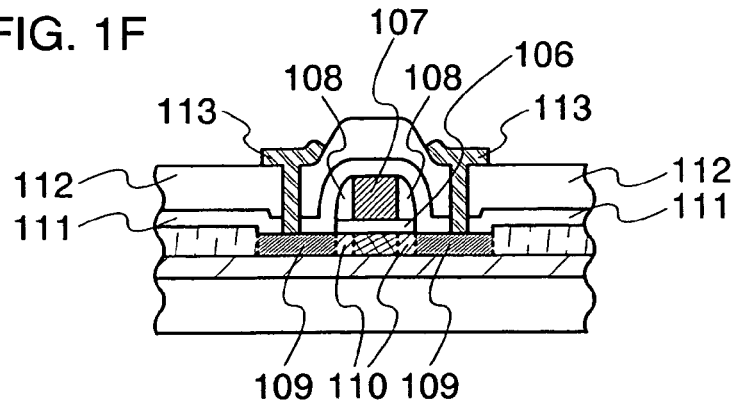

The structure of the manufactured thin film transistor is not limited to the structure shown in FIG. 1F. For example, the sidewall 108 may not be provided, and the low concentration impurity region 110 may be formed being overlapped with the gate electrode 107. When a P-channel thin film transistor is manufactured, the low concentration impurity region 110 may not be formed. If the sidewall 108 is not provided, the gate insulating film 106 exists over the oxide film 105 and the high concentration impurity region 109, as well.

By manufacturing the thin film transistor according to this embodiment mode, element isolation can be performed at a temperature which does not affect the glass substrate or the plastic substrate. Through element isolation, the element can be miniaturized to be as fine as or finer than an element in a case of a conventional LOCOS method. Since a peak shape is not formed, leak current is reduced.

EMBODIMENT MODE 2

Also in this embodiment mode, element isolation is performed on a semiconductor film by plasma treatment with the use of the high-density plasma treatment apparatus as shown in FIGS. 2A and 2B. One difference with Embodiment Mode 1 is that a film preventing oxidation of the semiconductor film is used as a gate electrode without being removed.

Figure 3A:
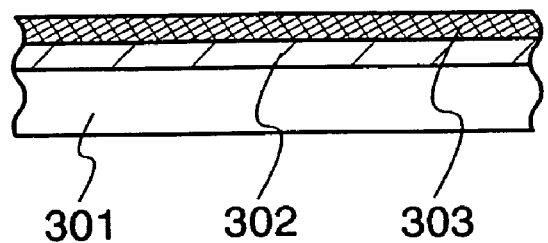
FIGS. 3A to 3D are cross-sectional views each showing a manufacturing process of a thin film transistor in Embodiment Mode 2.

A process of forming a base film 302 over a glass substrate 301 and forming a semiconductor film 303 thereover is the same as the process of Embodiment Mode 1 (see FIG. 3A). In addition, also in this embodiment mode, a heat-resistant plastic substrate can be used instead of the glass substrate. Other substrates may also be used as long as the substrates can withstand a temperature greater than or equal to 200° C. during plasma treatment.

Radical oxidation or radical nitridation shown in Embodiment Mode 1 is performed on the semiconductor film 303, thereby forming a gate insulating film 304. At this time, the gate insulating film 304 is formed so that the semiconductor film 303 is not completely oxidized or nitrided, that is, the semiconductor film 303 remains intact with a predetermined thickness (e.g., greater than or equal to 10 nm and less than or equal to 20 nm). The gate insulating film 304 may be formed over the semiconductor film 303 by a CVD method or a sputtering method. Subsequently, a film 305 preventing oxidation of the semiconductor film 303 is formed over the gate insulating film 304. As the oxidation preventing film 305, a tungsten film is formed by a sputtering method or the like in the same manner as in Embodiment Mode 1. In a case where radical nitridation is performed later, a film for preventing nitridation may be formed instead of the oxidation preventing film 305. In addition to the tungsten film, a film formed of a material which can prevent radical oxidation or radical nitridation of the semiconductor film 303 and can be used as a gate electrode, for example, a film of another metal, such as a titanium film, may also be used.

Figure 3B:
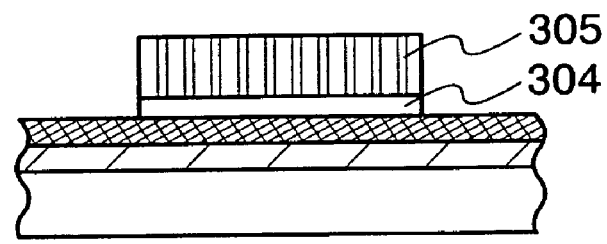

Thereafter, the gate insulating film 304 and the oxidation preventing film 305 are each formed into a predetermined pattern by a photolithography method. The oxidation preventing film 305 may be formed into a predetermined pattern by a droplet discharging method (ink jet method) or a screen printing method. Furthermore, the gate insulating film 304 is etched by wet etching or dry etching with the use of the pattern of the oxidation preventing film 305 as a mask. Accordingly, a surface of a region where element isolation of the semiconductor film 303 is performed is exposed (see FIG. 3B).

Figure 3C:
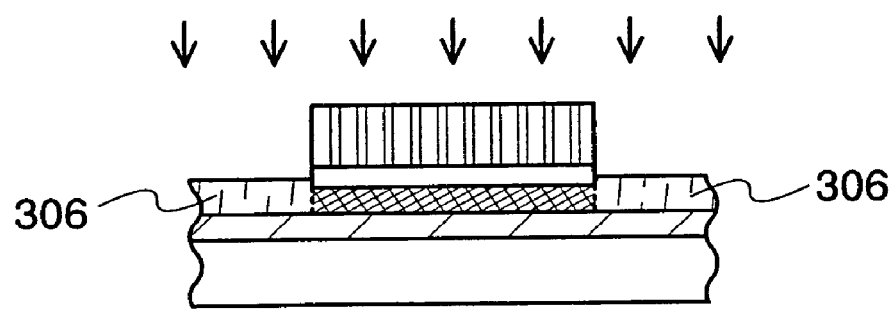

Then, radical oxidation is performed on the semiconductor film 303 by the method shown in Embodiment Mode 1, and an oxide film 306 shown in FIG. 3C is formed as an insulating film which isolates elements next to each other. When radical nitridation is performed, a nitride film is formed instead of the oxide film. It is desirable that radical oxidation be performed so that a region of the semiconductor film 303, which is not covered with the oxidation preventing film 305 is completely oxidized from an upper surface to a lower surface. However, if the elements next to each other are electrically insulated, a region where the oxide film 306 is not formed may remain intact on the inner side of the semiconductor film 303, that is, on the side which is in contact with the base film 302.

Figure 3D:
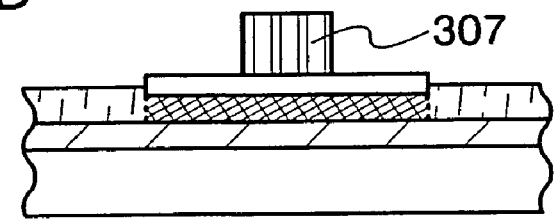

Next, as shown in FIG. 3D, a pattern of a gate electrode 307 is formed from the oxidation preventing film 305. At this time, a photolithography method may be used. The gate electrode 307 may be formed into a tapered shape.

After that, by performing the same process as in Embodiment Mode 1, a thin film transistor as shown in FIG. 1F can be manufactured.

This embodiment mode differs from Embodiment Mode 1 in terms of using the oxidation preventing film 305 for the formation of the gate electrode. Therefore, in this embodiment mode, in addition to an effect obtained in Embodiment Mode 1, the step of removing the oxidation preventing film that is performed in Embodiment Mode 1 is not necessary; thus, the process of manufacturing the thin film transistor can be simplified. Furthermore, because the oxidation preventing film 305 is used for forming the gate electrode without being removed, the oxidation preventing film 305 may be formed using a conductive material, the surface of which is oxidized by radical oxidation.

EMBODIMENT MODE 3

Also in this embodiment mode, element isolation is performed by plasma treatment on a semiconductor film with the use of the high-density plasma treatment apparatus as shown in FIGS. 2A and 2B. One difference with Embodiment Mode 1 is that a film preventing oxidation of the semiconductor film is formed of an insulating film and the oxidation preventing film is used as a gate insulating film without being removed.

Figure 4A:
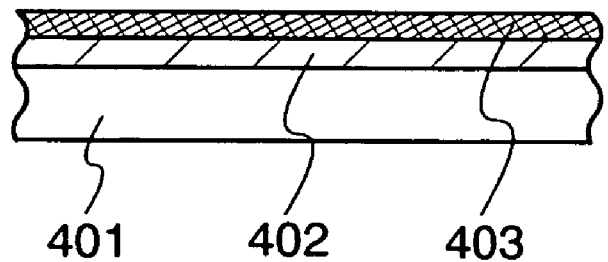
FIGS. 4A to 4D are cross-sectional views each showing a manufacturing process of a thin film transistor in Embodiment Mode 3.

A process of forming the base film 402 over the glass substrate 401 and forming the semiconductor film 403 thereover is the same as in Embodiment Mode 1 (see FIG. 4A). In addition, also in this embodiment mode, a heat-resistant plastic substrate can be used instead of the glass substrate. Other substrates may also be used as long as the substrates can withstand a temperature greater than or equal to 200° C. during plasma treatment.

Figure 4B:
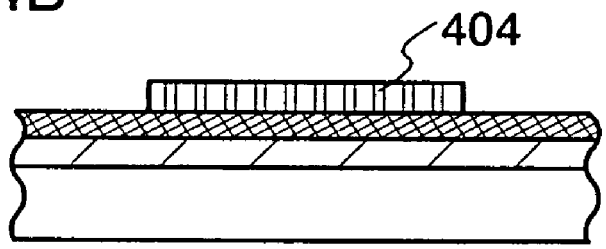

A film 404 preventing oxidation of the semiconductor film is formed over the semiconductor film 403 (see FIG. 4B). In this embodiment mode, a silicon oxide film, a silicon nitride film, or a $SiO_xN_y$ film (x, y>0) is formed over the entire surface of the semiconductor film 403 by a CVD method or the like and thereafter formed into a predetermined pattern by a photolithography method. As the oxidation preventing film 404, a film formed of an insulating material other than the above film may be used as long as the film can prevent radical oxidation of the semiconductor film 403 and can be used as a gate insulating film. By making a thickness of the oxidation preventing film 404 as thick as or thicker than that of the semiconductor film 403, radical oxidation of the semiconductor film 403 can be prevented without fail.

When radical oxidation is not performed but radical nitridation is performed, a nitridation preventing film has to be formed instead of the oxidation preventing film 404. In the same way, when both radical oxidation and radical nitridation are performed, an oxidation preventing film and a nitridation preventing film have to be formed.

Figure 4C:
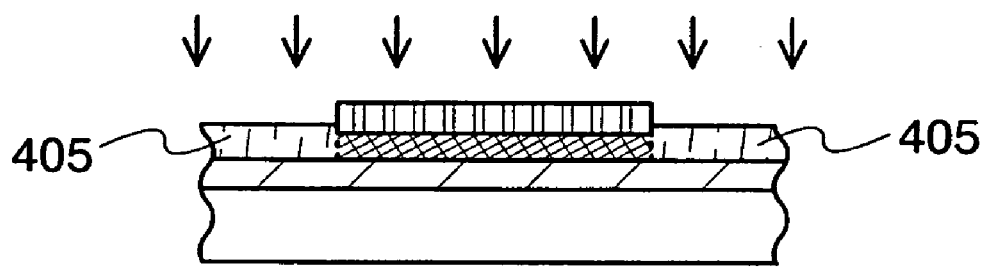
Figure 4D:
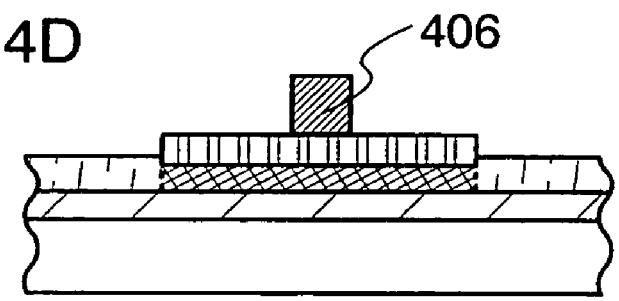

Next, in the same manner as in Embodiment Mode 1, an oxide film 405 shown in FIG. 4C is formed by performing radical oxidation. When radical nitridation is performed, a nitride film is formed instead of the oxide film 405.

Thereafter, unlike in Embodiment Mode 1, a gate electrode 406 is formed over the oxidation preventing film 404 without removal of the oxidation preventing film 404. In this embodiment mode, the oxidation preventing film 404 doubles as a gate insulating film. By performing the same process as in Embodiment Mode 1 for the rest of the process, a thin film transistor as shown in FIG. 1F can be manufactured.

This embodiment mode differs from Embodiment Mode 1 in terms of using the oxidation preventing film 404 as the gate insulating film. Therefore, in this embodiment mode, in addition to an effect obtained in Embodiment Mode 1, the step of removing the oxidation preventing film which is performed in Embodiment Mode 1 is not necessary; thus, the process of manufacturing the thin film transistor can be simplified.

EMBODIMENT MODE 4

In this embodiment mode, element isolation is performed by plasma treatment on a semiconductor film with the use of the high-density plasma treatment apparatus as shown in FIGS. 2A and 2B, thereby manufacturing an inversely staggered thin film transistor.

Figure 6A:
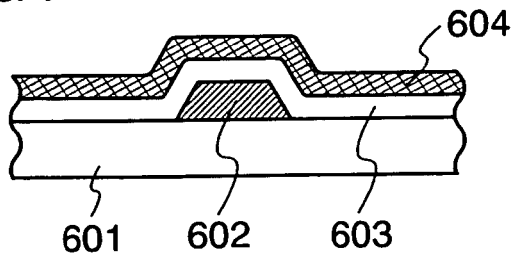
FIGS. 6A to 6E are cross-sectional views each showing a manufacturing process of a thin film transistor in Embodiment Mode 4.

As shown in FIG. 6A, a gate electrode 602, a gate insulating film 603, and a semiconductor film 604 are formed over a glass substrate 601. In the same manner as other embodiment modes, a heat-resistant plastic substrate can be used instead of the glass substrate. Other substrates may also be used as long as the substrates can withstand a temperature of greater than or equal to 200° C. during plasma treatment.

The gate electrode 602, the gate insulating film 603, and the semiconductor film 604 are formed by the method shown in Embodiment Mode 1. The gate electrode 602 may be formed into a tapered shape.

Figure 6B:
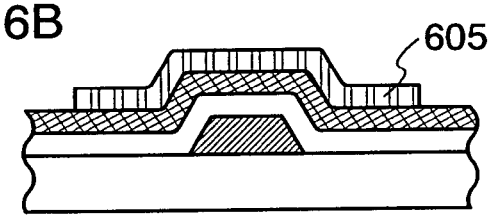

A film 605 preventing oxidation of the semiconductor film is formed into a predetermined pattern 1 over the semiconductor film 604 by the method shown in Embodiment Mode 1 (see FIG. 6B). Although the tungsten film shown in Embodiment Mode 1 may be used as the oxidation preventing film 605, a film formed of a material other than tungsten may also be used as long as the film can prevent radical oxidation of the semiconductor film 604. When radical oxidation is not performed but radical nitridation is performed, a film preventing nitridation of the semiconductor film 604 is formed instead of the oxidation preventing film 605.

Figure 6C:
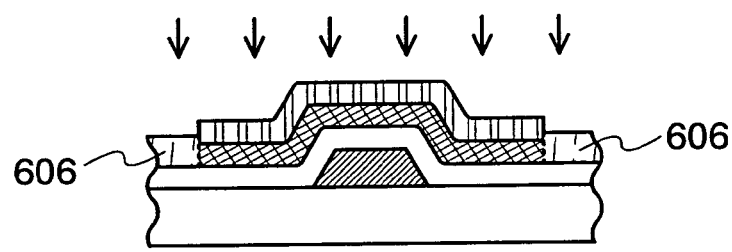

Next, the semiconductor film 604 is oxidized by radical oxidation by the method shown in Embodiment Mode 1. As shown in FIG. 6C, an oxide film 606 is formed as an insulating film in a region of the semiconductor film 604, which is not covered with the oxidation preventing film 605, and elements next to each other are isolated from one another. As explained in Embodiment Mode 1, there is a case where the semiconductor film 604 is not necessary to be completely oxidized by radical oxidation from an upper surface to a lower surface (a surface which is in contact with the gate insulating film 603). When radical nitridation is performed instead of radical oxidation, a nitride film is formed instead of the oxide film 606.

Figure 6D:
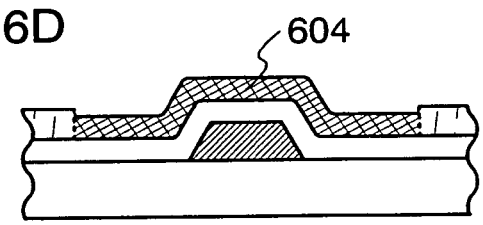

As shown in FIG. 6D, the oxidation preventing film 605 is removed by the method shown in Embodiment Mode 1. Thereafter, even if the semiconductor film 604 is cleaned with hydrofluoric acid, a peak shape which has been conventionally formed is not formed. This is because the semiconductor film 604 is not formed into an island-shaped pattern, and the oxide film 606 exists. In addition, by controlling time for cleaning with hydrofluoric acid, the oxide film 606 which is slightly thicker than the semiconductor film 604 over which the oxidation preventing film 605 is removed can be planarized to be as thick as the semiconductor film 604.

Figure 6E:
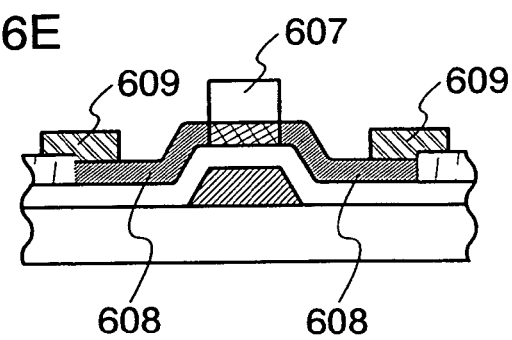

A protective film 607 formed of an insulating material such as silicon nitride is formed into a predetermined pattern over the semiconductor film 604 so as to cover the gate electrode 602 (see FIG. 6E). A region covered with this protective film 607 is not doped with an impurity imparting N-type conductivity such as phosphorus or an impurity imparting P-type such as boron. It is to be noted that, when an insulating film such as a silicon nitride film is formed as the oxidation preventing film 605, the oxidation preventing film 605 can be used for forming the protective film 607 without being removed as described above. In this case, the process of manufacturing the inversely staggered thin film transistor can be simplified.

Then, the semiconductor film 604 is doped with an impurity imparting N-type conductivity such as phosphorus by using the protective film 607 as a mask, and impurity regions 608, that is, a source region and a drain region are formed to adjoin the oxide films 606 (the insulating film which isolates the elements next to each other). An impurity imparting P-type conductivity such as boron may be added instead of an impurity imparting N-type conductivity. As in Embodiment Mode 1, a low concentration impurity region (LDD region) may be provided to adjoin the impurity region 608.

Thereafter, a wiring 609 is formed so as to be electrically connected to the impurity region 608. At this time, the wiring 609 can have the same structure as that of the wiring 113 shown in Embodiment Mode 1. The wiring 609 may be extended over the oxide film 606.

A structure of the manufactured inversely staggered thin film transistor is not limited to the structure shown in FIG. 6E. For example, as in Embodiment Mode 1, a low concentration impurity region (LDD region) may be provided to adjoin the impurity region 608.

By manufacturing the inversely staggered thin film transistor according to this embodiment mode, the same effect as that of Embodiment Mode 1 can be obtained. In other words, element isolation can be performed at a temperature which does not affect a glass substrate or a plastic substrate. By the element isolation, the element can be miniaturized to be as fine as or finer than an element in a case of a conventional LOCOS method. Since a peak shape is not formed, leak current is reduced.

EMBODIMENT MODE 5

In this embodiment mode, a single crystal silicon wafer is used. The single crystal silicon wafer to be used has a diameter of 100 to 300 mm, and its thickness is thinned to be greater than or equal to 1 μm and less than or equal to 20 μm by grinding and polishing, preferably less than or equal to 5 μm. By making the single crystal silicon wafer to be thin as described above, the single crystal silicon wafer greatly differs from a conventional single crystal silicon wafer with a thickness of 0.7 mm, in terms of having flexibility and light transmissivity. In addition, in this embodiment mode, a single crystal silicon wafer of (110) planes, (111) planes, or the like as well as (100) planes can be used.

The single crystal silicon wafer is fixed to a supporting body, and the surface of the single crystal silicon wafer is ground to be greater than or equal to 30 μm and less than or equal to 50 μm thick. Furthermore, a ground surface of the single crystal silicon wafer is polished to be less than or equal to 20 μm thick, for example, 5 μm thick. In this polishing step, an abrasive grain (a polishing material) having a smaller grain diameter than that of an abrasive grain used in the previous grinding step is used, and the ground surface of the single crystal silicon wafer is polished so that the surface is flat and its thickness is uniform. The single crystal silicon wafer polished to be thin can be described as a single crystal silicon film, and a deep scratch which can be recognized by eyes over its surface and a crack of its edge portion are not generated.

Thereafter, the single crystal silicon wafer (the single crystal silicon film) is attached to a substrate having a flat surface, such as a glass substrate or a heat-resistant plastic substrate, and the supporting body is separated. If the supporting body can be directly used as a substrate, the single crystal silicon wafer (the single crystal silicon film) is attached to the substrate, and the step of separating the supporting body is not necessary.

After that, according to Embodiment Mode 1, 2, or 3, a thin film transistor can be manufactured.

This embodiment mode differs from other embodiment modes in terms of using, as a semiconductor film, the single crystal silicon film which is formed by grinding and polishing the single crystal silicon wafer. Therefore, in this embodiment mode, a thin film transistor showing as high field effect mobility as a field effect transistor which is manufactured over the single crystal silicon wafer can be obtained in addition to the effect achieved in Embodiment Mode 1. Moreover, since the single crystal silicon wafer as thin as less than or equal to 20 μm is used as a semiconductor film, an insulating film which isolates elements next to each other can be easily formed by radical oxidation or radical nitridation.

EMBODIMENT 1

Examples of a liquid crystal display device and an electroluminescence display device are shown as a display device in which a semiconductor element (thin film transistor) manufactured by the invention disclosed in this specification is used. Hereinafter, an electroluminescence display device is referred to as an EL display device.

Figure 7:
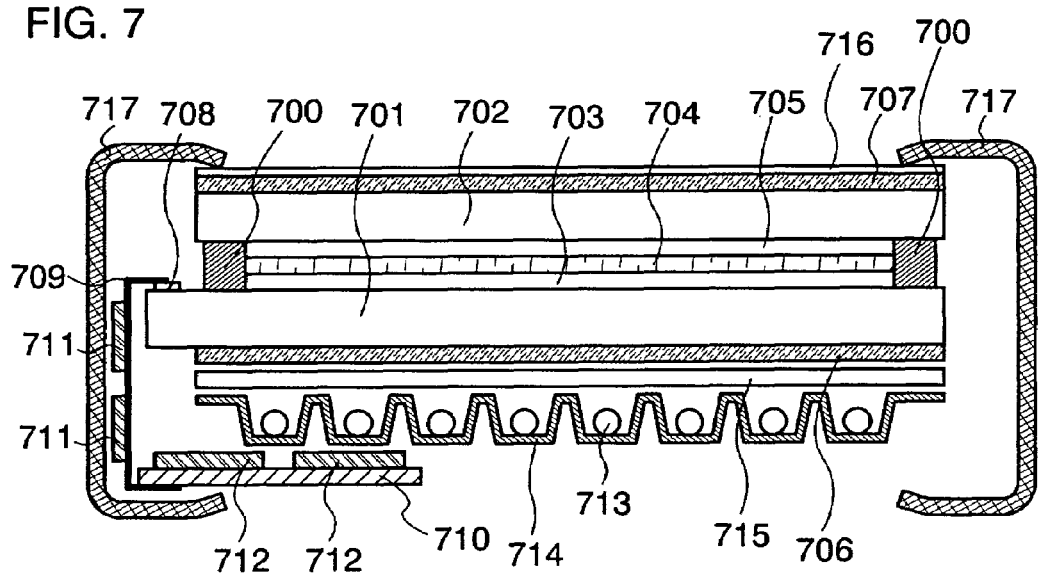
FIG. 7 is a cross-sectional view of a liquid crystal display device.

FIG. 7 shows an example of a cross section of a liquid crystal display device. The liquid crystal display device has a liquid crystal layer 704 interposed between a first substrate 701 and a second substrate 702, which are attached to each other by a sealing material 700. At least a pixel portion 703 is formed over the first substrate 701 and at least a coloring layer 704 is formed over the second substrate 702 by a printing method or the like. The coloring layer 705 is necessary in performing color display. In a case of the RGB system, a coloring layer corresponding to each color of red, green, and blue is provided for each pixel. Polarizing plates 706 and 707 are provided outside the first substrate 701 and the second substrate 702, respectively. In addition, a protective film 716 is formed over the surface of the polarizing plate 707 to reduce the external impact.

A thin film transistor corresponding to each pixel is formed in a pixel portion 703, and the thin film transistor manufactured by the invention disclosed in this specification can be applied. Accordingly, since leak current of the thin film transistor of each pixel is small, defects of a display image can be reduced.

A wiring substrate 710 is connected to a connection terminal 708 provided over the first substrate 701 through an FPC 709. A driver circuit 711 (an IC chip or the like) is provided for the FPC 709 or a connection wiring, and an external circuit 712 such as a control circuit or a power supply circuit is provided over the wiring substrate 710.

A cold cathode tube 713, a reflecting plate 714, and an optical film 715 are a backlight unit, which serves as a light source. The first substrate 701, the second substrate 702, the above light source, the wiring substrate 710, and the FPC 709 are held and protected by a bezel 717.

Figure 8A:
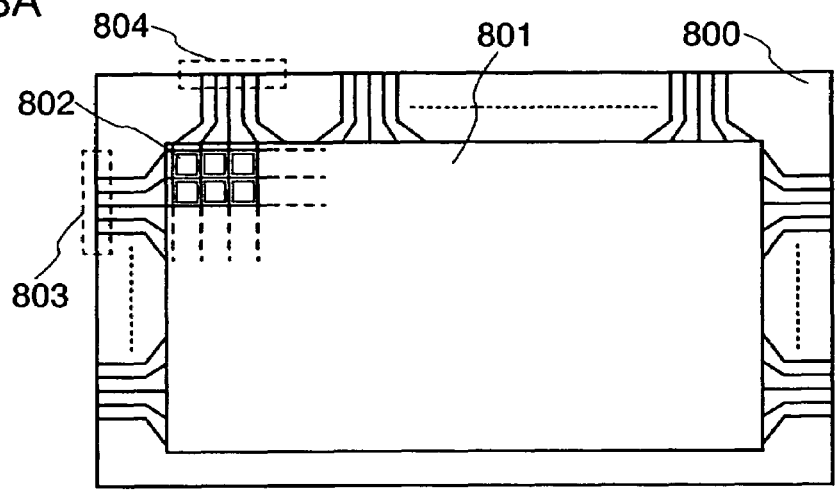
FIGS. 8A to 8C are schematic views each showing a surface of a display device.
Figure 8B:
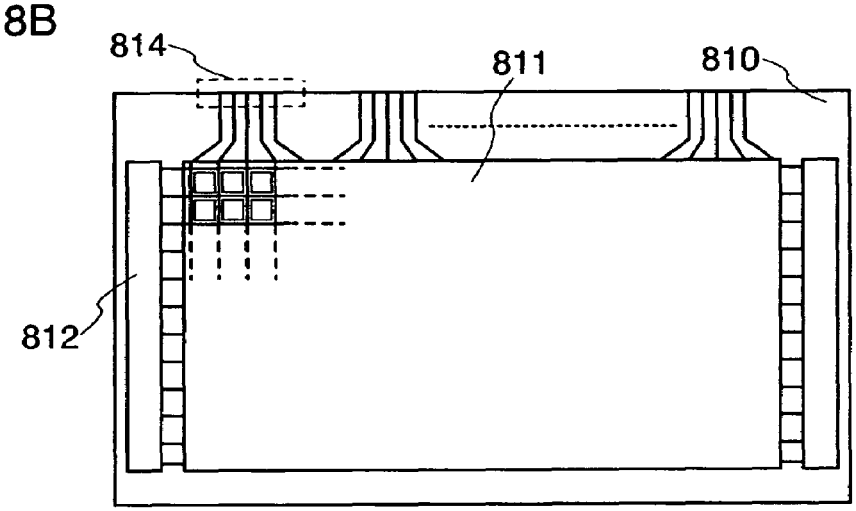
Figure 8C:
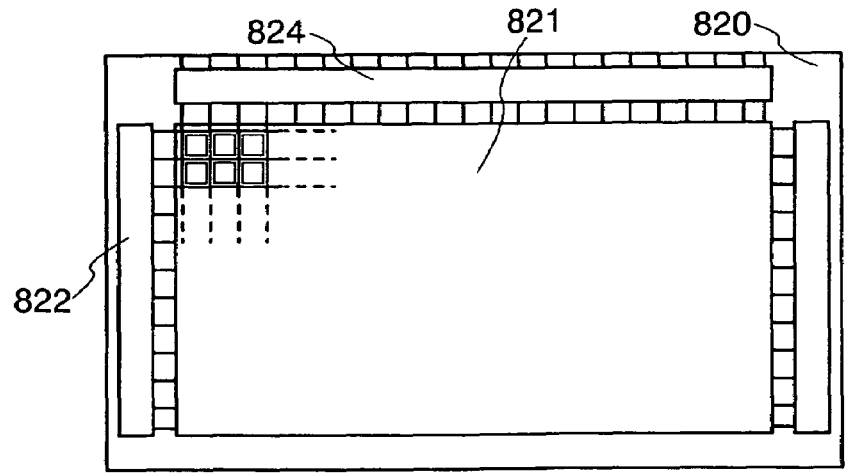

FIGS. 8A to 8C are schematic diagrams of a display device such as a liquid crystal display device or an EL display device seen from the top side.

In FIG. 8A, a pixel portion 801 where a plurality of pixels 802 is aligned in a matrix form, a scanning line input terminal 803, a signal line input terminal 804 are formed over a substrate 800. A scanning line extending from the scanning line input terminal 803 and a signal line extending from the signal line input terminal 804 intersect; accordingly, the pixels 802 are aligned in a matrix form. Each of the plurality of pixels 802 is provided with a thin film transistor and a pixel electrode. Although FIG. 8A shows an example in which signals input to the scanning line and the signal line are controlled by a driver circuit connected to outside a substrate through the scanning line input terminal 803 and the signal line input terminal 804, a COG method by which a driver circuit is formed over a substrate may be employed.

FIG. 8B shows an example in which a pixel portion 811 and a scanning line driver circuit 812 are formed over a substrate 810. Reference numeral 814 denotes the same signal line input terminal as that in FIG. 8A. In addition, FIG. 8C shows an example in which a pixel portion 821, a scanning line driver circuit 822, and a signal line driver circuit 824 are formed over a substrate 820.

The scanning line driver circuit 812 shown in FIG. 8B and the scanning line driver circuit 822 and the signal line driver circuit 824 shown in FIG. 8C are formed using a thin film transistor, and the thin film transistor can be formed concurrently with a thin film transistor provided in the pixel portion. Since high speed operation is required for the scanning line driver circuit and the signal line driver circuit, it is desirable to employ, for the thin film transistor used for the scanning line driver circuit and the signal line driver circuit, a thin film transistor in which a crystalline semiconductor film, not an amorphous semiconductor film, is used for a channel formation region.

By employing the thin film transistor manufactured by the invention disclosed in this specification for the scanning line driver circuit 812 shown in FIG. 8B, the scanning line driver circuit 822 and the signal line driver circuit 824 shown in FIG. 8C as well as the pixel portions shown in FIGS. 8A to 8C, an area which is occupied by these driver circuits over the substrate 810 or the substrate 820 can be reduced.

Figure 9:
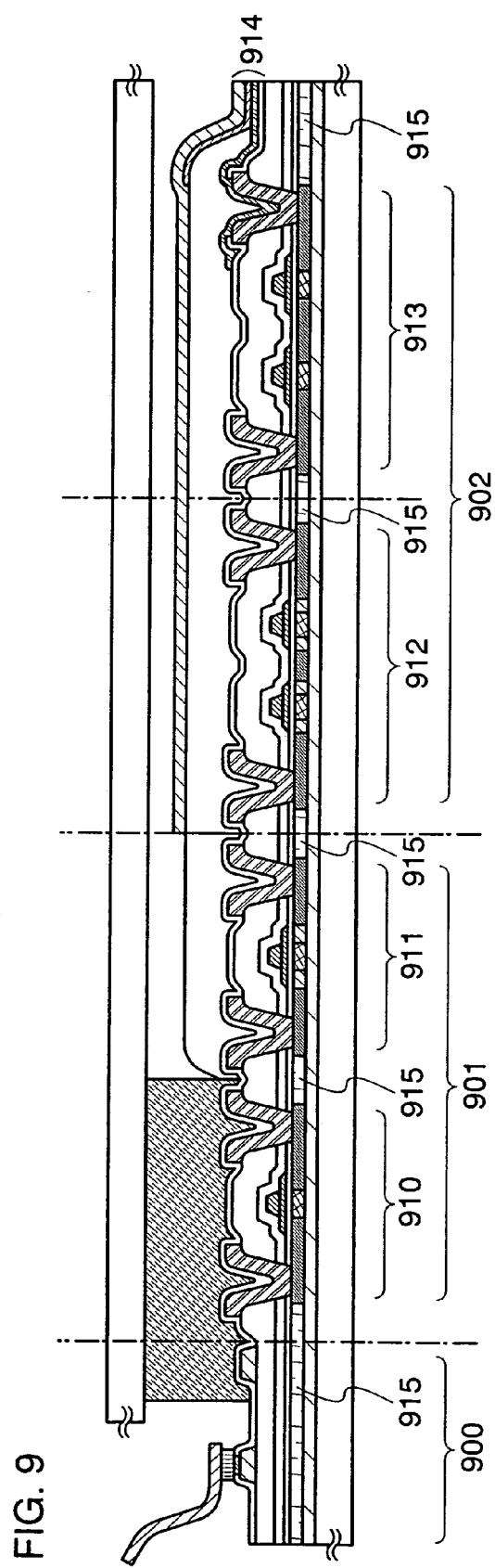
FIG. 9 is a cross-sectional view of an electroluminescence display device.

FIG. 9 shows an example of a cross section of an EL display device. This EL display device has a terminal portion 900, a driver circuit portion 901, and a pixel portion 902. The driver circuit portion 901 includes a P-channel thin film transistor 910 and an N-channel thin film transistor 911, and the pixel portion 902 includes a switching thin film transistor 912 and a driving thin film transistor 913. Both the driver circuit portion 901 and the pixel portion 902 are formed over the same substrate. An oxide film 915 is formed by radical oxidation in order to isolate the thin film transistors next to each other in each of the driver circuit portion 901 and the pixel portion 902. A nitride film may be formed by radical nitridation instead of the oxide film 915.

Although a so-called multigate structure is described as the switching thin film transistor 912 and the driving thin film transistor 913 in FIG. 9, a single gate structure which is the same as in the driver circuit portion 901 may be employed.

For example, the switching thin film transistor 912 can be an N-channel thin film transistor, and the driving thin film transistor 913 can be a P-channel thin film transistor. A gate electrode of the switching thin film transistor 912 is electrically connected to a scanning line, and a wiring connected to a source region or a drain region of the switching thin film transistor 912 is electrically connected to a signal line through a contact hole provided in an interlayer insulating film.

A wiring connected to a source region or a drain region of the driving thin film transistor 913 through the contact hole provided in the interlayer insulating film is electrically connected to a light-emitting element 914 in which an anode, a cathode, and a light-emitting layer provided therebetween are stacked. Although a structure is shown in FIG. 9, in which the wiring is provided over the interlayer insulating film and another interlayer insulating film is further provided thereover and the light-emitting element 914 is formed thereover, the present invention is not necessarily limited to this structure. As the interlayer insulating film, a transparent conductive film formed by a sputtering method, a droplet discharging method (ink jet method), a screen printing method, or the like, such as an ITO (indium tin oxide) film can be provided for one or both of the cathode and the anode of the light-emitting element 914. A material for forming the transparent conductive film is not limited to ITO, and other material having light transmissivity and also conductivity may also be used. By using the transparent conductive film for both the cathode and the anode, light from the light-emitting layer can be emitted upward and downward; therefore, an image can be seen from both a front side and a back side of the EL display device.

The thin film transistor manufactured by the invention disclosed in this specification can be applied to the pixel portion 902. Accordingly, as in the case of the liquid crystal display device, defects of a display image can be reduced. In addition, by applying the thin film transistor to the driver circuit portion 901 as well as the pixel portion 902, an area which is occupied by the driver circuit portion 901 over the substrate can be reduced.

The display device shown in this embodiment is mounted on various electronic apparatuses. As examples of such electronic apparatuses, a TV set, a camera (such as a video camera or a digital camera), a navigation system, an audio reproducing device (such as a car audio or an audio component), a personal computer, a game machine, a portable information terminal (a mobile computer, a portable telephone set, a portable game machine, or an electronic book), an image reproducing device provided with a recording medium (specifically, a device which reproduces a recording medium such as a digital versatile disc (DVD) and which is provided with a display device for displaying the reproduced image), and the like can be given. The display device shown in this embodiment is mounted on a display portion or the like of these electronic apparatuses.

Figure 10A:
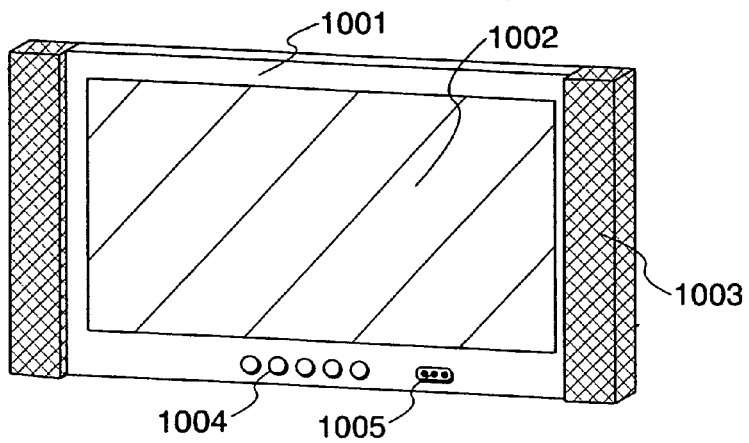
FIGS. 10A to 10D are views each showing an electronic apparatus.

FIG. 10A is an example of a TV set, which includes a housing 1001, a display portion 1002, a speaker 1003, an operation portion 1004, a video input terminal 1005, and the like. The display device such as the liquid crystal display device or the EL display device using the thin film transistor manufactured by the invention disclosed in this specification is applied to the display portion 1002.

Figure 10B:
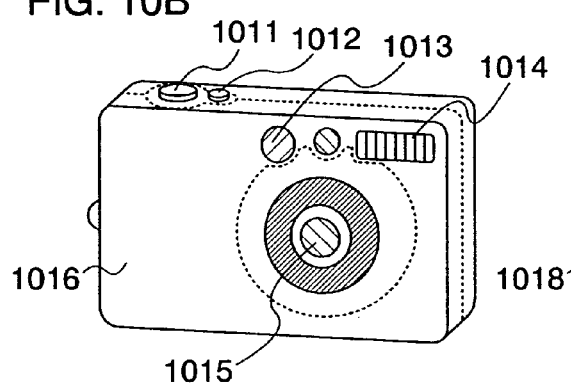
Figure 10C:
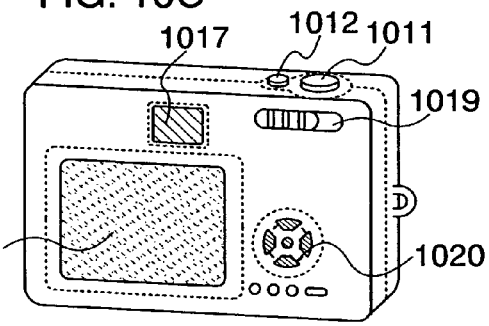

FIGS. 10B and 10C each show an example of a digital camera. FIG. 10B is a view of a front side of the digital camera, where reference numeral 1011 denotes a release button; 1012, main switch; 1013, a finder window; 1014, a flash lamp; 1015, a lens; and 1016, a housing. FIG. 10C is a view of a back side of the digital camera, where numeral 1017 denotes a finder eyepiece window; 1018, a display portion; and 1019 and 1020, operational buttons. The display device such as the liquid crystal display device or the EL display device using the thin film transistor manufactured by the invention disclosed in this specification is applied to the display portion 1018.

Figure 10D:
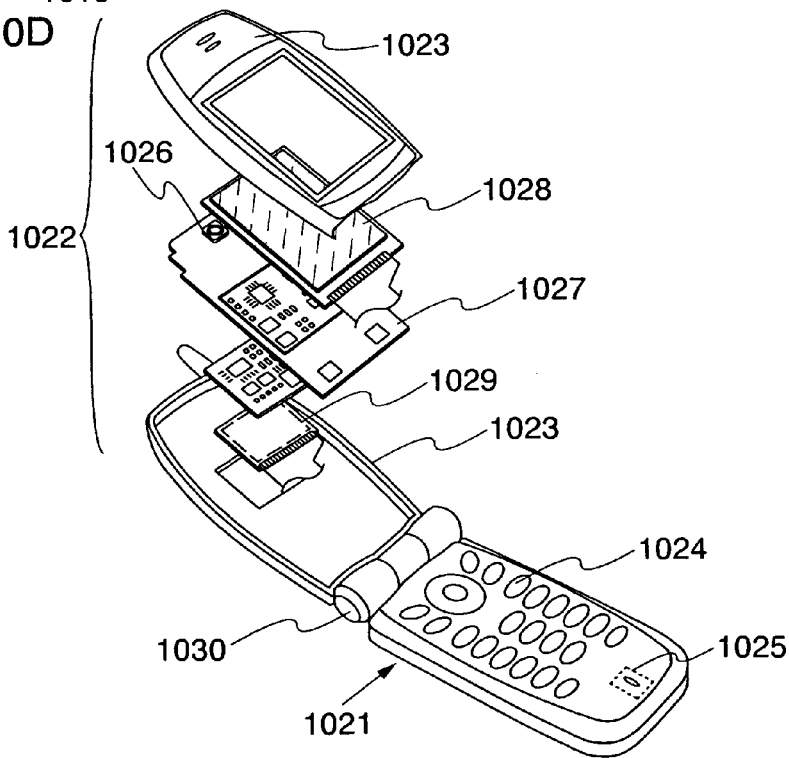

FIG. 10D shows an example of a mobile phone, which includes a main body (A) 1021 provided with operation switches 1024, a microphone 1025, and the like and a main body (B) 1022 provided with a display panel (A) 1028, a display panel (B) 1029, a speaker 1026, and the like. The main body (A) 1021 and the main body (B) 1022 are connected to each other by a hinge 1030 so as to be opened and closed. The display panel (A) 1028 and the display panel (B) 1029 are incorporated together with a circuit substrate 1027 into a housing 1023 of the main body (B) 1022. Pixel portions of the display panel (A) 1028 and the display panel (B) 1029 are arranged so as to be seen from an opening window formed in the housing 1023. The display device such as the liquid crystal display device or the EL display device using the thin film transistor manufactured by the invention disclosed in this specification is applied to the display panel (A) 1028 and the display panel (B) 1029.

The specifications of the display panel (A) 1028 and the display panel (B) 1029, such as the number of pixels can be appropriately set in accordance with the function of the mobile phone. For example, the display panel (A) 1028 and the display panel (B) 1029 can be used in combination as a main display screen and a sub-display screen, respectively.

By using such a display panel, the display panel (A) 1028 can be a high-definition color display screen displaying characters or images, and the display panel (B) 1029 can be a unicolor information display screen displaying character information. In particular, by making the display panel (B) 1029 an active matrix type with higher definition, a variety of character information can be displayed and an information display density per one screen can be improved. For example, the display panel (A) 1028 is set to be QVGA (320×240 dots) which is 2 to 2.5 inches, has 64 gradations, and 260,000 colors, and the display panel (B) 1029 is set to be a high-definition panel with 180 to 220 ppi and unicolor of 2 to 8 gradations so that alphabets, hiragana, katakana, numbers, Chinese characters, and the like can be displayed.

The mobile phone relating to this embodiment can be changed into various modes in accordance with its function and intended purpose. For example, the mobile phone may be a camera-equipped mobile phone by incorporating an image pickup device into a portion such as the hinge 1030. In addition, a structure may be employed in which the operation switches 1024, the display panel (A) 1028, and the display panel (B) 1029 are incorporated into one housing.

This embodiment can be combined with Embodiment Modes 1 to 5 to be implemented.

EMBODIMENT 2

A semiconductor element (thin film transistor) manufactured by the invention disclosed in this specification can be used for a semiconductor device such as a thin film integrated circuit or a non-contact thin film integrated circuit device (also referred to as an IC card, a wireless IC tag, or an RFID (radio frequency identification) tag). By attaching this non-contact thin film integrated circuit device to various electronic apparatuses shown in Embodiment 1, a distribution channel or the like of the electronic apparatus can be clarified. A frequency band which is used in the non-contact thin film integrated circuit device is, for example, 13.56 MHz, 2.45 GHz, and UHF (ultra high frequency). Hereinafter, the non-contact thin film integrated circuit device is referred to as an RFID tag for explanation.

Figure 11A:
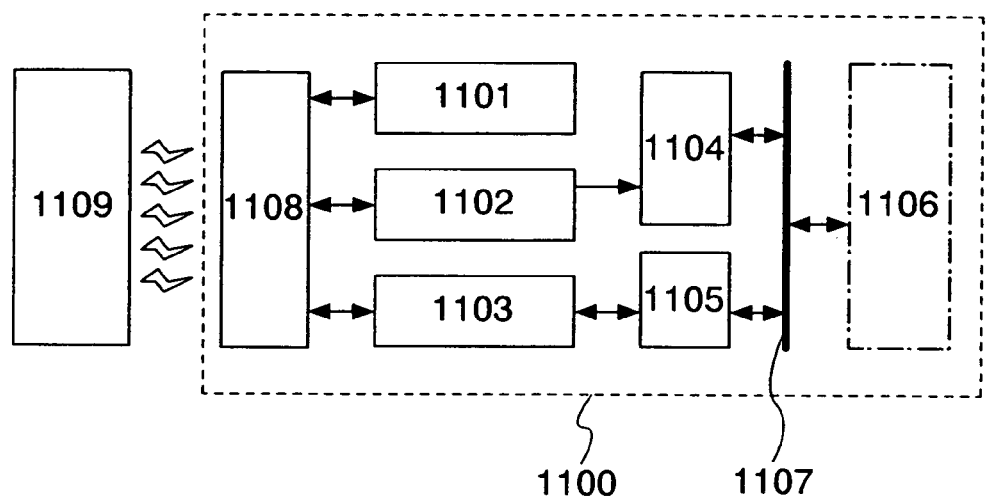
FIGS. 11A and 11B are block diagrams each showing an RFID tag.
Figure 11B:
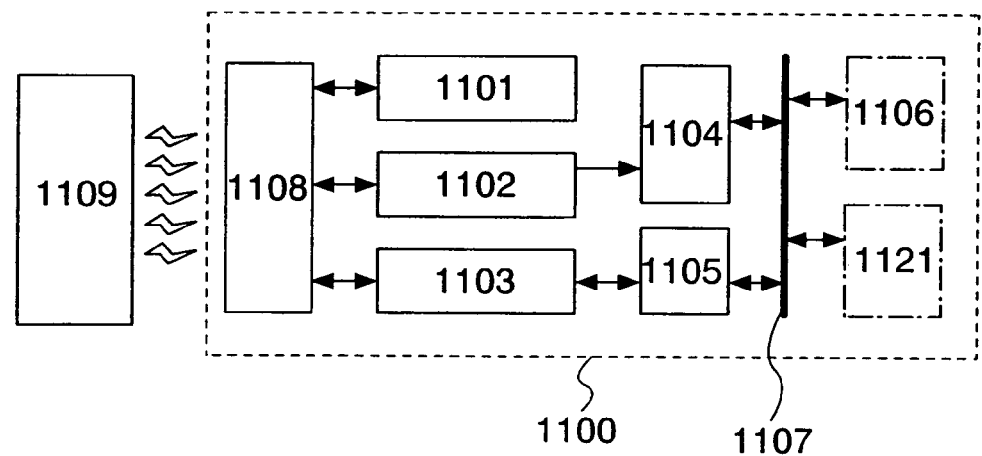

FIGS. 11A and 11B each are a block diagram of an example of an RFID tag. An RFID tag 1100 can communicate data wirelessly, which includes a power supply circuit 1101, a clock generation circuit 1102, a data demodulation/modulation circuit 1103, a control circuit 1104, an interface circuit 1105, a memory circuit 1106, a bus 1107, and an antenna 1108. FIG. 11B shows an RFID tag provided with an CPU 1121 in addition to content of the RFID tag shown in FIG. 11A.

The power supply circuit 1101 generates electric power supply based on an alternating current signal inputted from the antenna 1108. The clock generation circuit 1102 generates a clock signal based on a signal inputted from the antenna 1108. The data demodulation/modulation circuit 1103 demodulates/modulates data communicated with a reader/writer 1109. The control circuit 1104 controls the memory circuit 1106. The antenna 1108 receives a signal and transmits data.

As a material forming the antenna 1108, for example, gold, silver, copper, aluminum, ferrite, or ceramics can be used. As a shape of the antenna 1108, for example, a dipole shape, a loop shape, a spiral shape, or a flat rectangular solid patch shape can be used.

The thin film transistor manufactured by the invention disclosed in this specification can be used as a circuit constituting the RFID tag 1100. The antenna 1108 is provided so as to be electrically connected to the thin film transistor. The antenna 1108 can be formed together with the thin film transistor over a substrate by a combination of a photolithography method and a sputtering method or a CVD method, a plating method, a screen printing method, a droplet discharging method (ink jet method), or the like. In addition, a ready-made component is used as the antenna 1108, and the component and the substrate over which the thin film transistor is formed are attached to each other, having a conductive paste therebetween; accordingly, the antenna 1108 and the thin film transistor can be electrically connected to each other.

As the memory circuit 1106, a DRAM, a SRAM, a mask ROM, an EPROM (erasable programmable read only memory), an EEPROM (electrically erasable programmable read only memory), a flash memory, an organic memory, or the like can be used. The organic memory has a structure in which an organic compound layer is provided between a pair of electrodes, or a structure in which a layer containing an organic compound and an inorganic compound is provided between the pair of electrodes. The organic memory contributes to reduction in size, thickness, and weight of the RFID tag by being applied to the memory circuit 1106 of the RFID tag.

Figure 12:
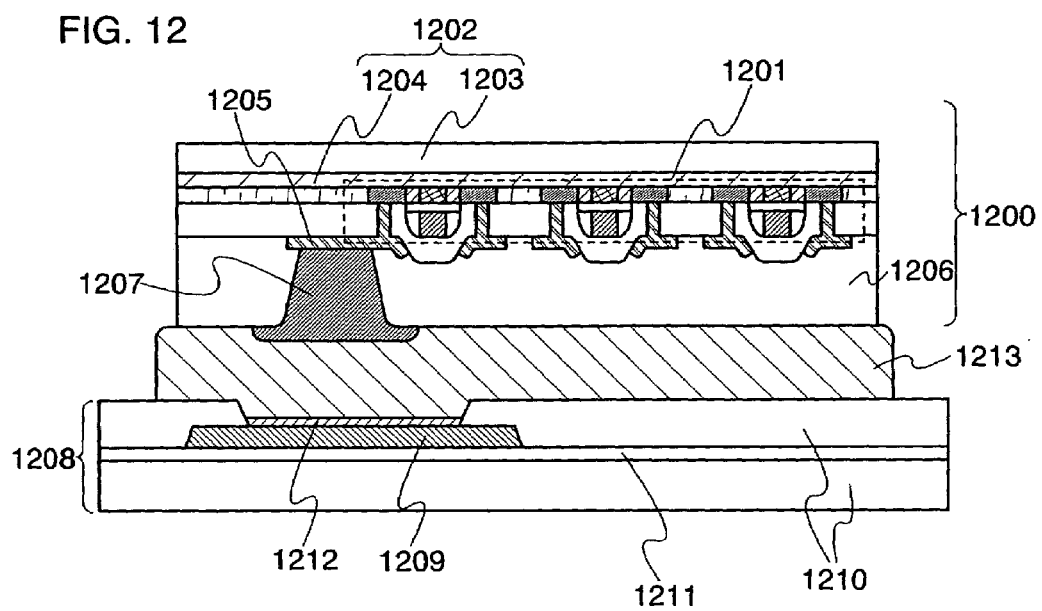
FIG. 12 is a cross-sectional view of an RFID tag.
Figure 13A:
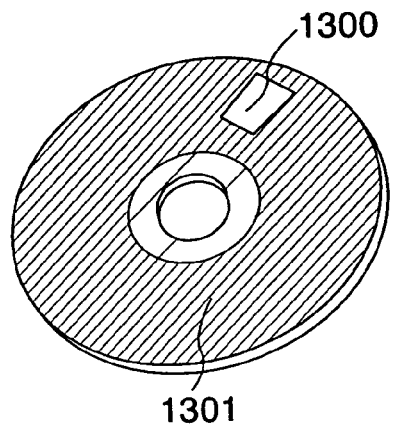
FIGS. 13A to 13E are views each showing an example of use of an RFID tag.
Figure 13B:
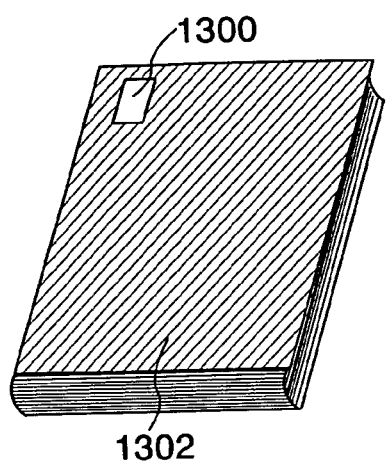
Figure 13C:
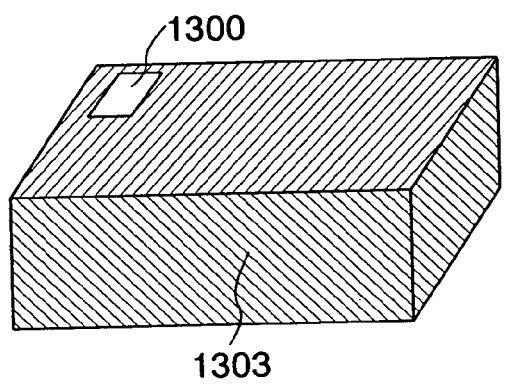
Figure 13D:
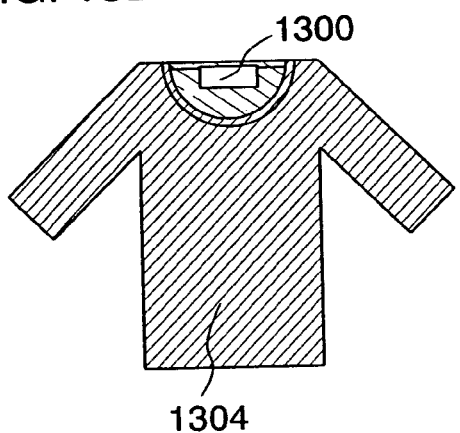
Figure 13E:
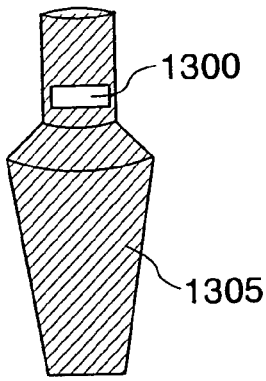

FIG. 12 exemplifies a cross section of an RFID tag, which particularly shows a state in which a thin film transistor used for a circuit constituting the RFID tag and an antenna are electrically connected to each other. The example shown in FIG. 12 corresponds to a case where a ready-made component is used as the antenna.

The structure manufactured according to Embodiment Modes 1 to 5 is employed for a thin film transistor 1201. A case where a mask ROM is manufactured as the circuit constituting the RFID tag by using the thin film transistor 1201 will be explained. In the mask ROM, the thin film transistor 1201 is used for a memory cell and is formed by a photolithography method. At this time, when a contact hole for a wiring which is connected to, for example, a drain region of the thin film transistor 1201 is opened, 1 (on) is programmed into the memory cell, whereas when the contact is not opened, 0 (off) is programmed into the memory cell. In a step of exposing a photoresist, the photoresist over the region where the contact hole is opened is irradiated with an electron beam or a leaser before or after exposing the photoresist through a reticle (photomask) by an exposure apparatus such as a stepper. Thereafter, steps of developing, etching, peeling of the photoresist or the like are performed as usual. This makes it possible to form a pattern where the contact hole is opened and a pattern where the contact hole is not opened only by selecting whether or not the electron beam or the laser is emitted, without changing the reticle (photomask).

An insulating film 1206 made of an epoxy resin or the like is formed so as to cover the thin film transistor 1201. Thereafter, when the thin film transistor 1201 is formed over a glass substrate, the glass substrate is separated by a predetermined process, and a film 1202 in which an adhesion layer 1204 is formed over a surface of a base material 1203 is attached instead of the glass substrate. This film 1202 has flexibility.

The glass substrate is not required to be peeled, unlike the case as described above. In this case, because the glass substrate used for forming the thin film transistor 1201 has a thickness of approximately 0.5 mm even when the glass substrate is thin, the glass substrate over which at least the thin film transistor 1201 is formed is ground and polished as shown in Embodiment Mode 5 to reduce the thickness to less than or equal to 50 µm, which is thin enough for the glass substrate to bend. In addition, when the thin film transistor 1201 is formed over a flexible plastic substrate, it is not necessary to separate this plastic substrate.

It is preferable to use a film to which measure to prevent charge due to static electricity or the like is given (hereinafter, referred to as an antistatic film) as the film 1202. As the antistatic film, a film with an antistatic material dispersed in a resin and a film with an antistatic material formed in at least part thereof are given as examples. Metal, a conductive material such as ITO (indium tin oxide), and a surface active agent can be used as the antistatic material. By employing the antistatic film for the film 1202, an adverse effect on characteristics of the thin film transistor 1202 due to static electricity from outside can be prevented.

In the insulating film 1206, an opening is provided over a wiring 1205 electrically connected to a source region or a drain region of the thin film transistor 1201. An electrode (bump) 1207 is formed in the opening.

The film 1202 or the flexible substrate, over which the thin film transistor 1201 is formed, is divided into a plurality of chips each having a side of several mm (for example, greater than or equal to 2 mm and less than or equal to 9 mm) so as not to break the circuit formed using the thin film transistor 1201. FIG. 12 exemplifies a chip 1200 which is obtained by being divided.

An antenna part 1208 has an antenna wiring 1209 which is interposed between two base materials 1010 made of a polyimide resin or the like, with an adhesive layer 1211 on one surface of the antenna wiring 1209. One of the two base materials 1210 is provided with an opening for exposing part of the antenna wiring 1209. In this opening, a pad 1212 is formed to be in contact with the antenna wiring 1209. The pad 1212 is formed of a metal material which is not easily oxidized, for example, a film having gold on its surface.

Thereafter, the antenna part 1208 is pressure-bonded to the chip 1200 by heating with the use of an anisotropic conductive paste 1213; accordingly, the wiring 1205 of the thin film transistor 1201 and the antenna wiring 1209 are electrically connected to each other.

Since a manufacturing cost of the RFID tag is higher than that of a conventional barcode, cost reduction is necessary. The invention disclosed in this specification makes it possible to miniaturize the circuit constituting the RFID tag; therefore, the chip 1200 can be smaller. Consequently, the number of the chips 1200 obtained by dividing one film 1202 or the flexible substrate is increased, thereby reducing a manufacturing cost per one RFID tag. Furthermore, the invention disclosed in this specification makes it possible to reduce leak current of the thin film transistor used for the circuit constituting the RFID tag; therefore, a high-quality RFID tag with little variation in performance can be manufactured.

FIGS. 13A to 13E each show an example of the use of an RFID tag. The RFID tag is attached to goods such as a recording medium 1301 itself where information is recorded, a case in which the recording medium 1301 is incorporated, a book 1302, a package 1303 of an article, clothes 1304, and a glass or plastic bottle 1305, whereby the RFID tag can be used for application of management of sales, stock, rental and return, prevention of loss or theft, collection, and the like. In each of FIGS. 13A to 13E, an example of an attachment location 1300 of the RFID tag is shown. Since the RFID tag shown in this embodiment has flexibility, the RFID tag can be easily attached to an uneven surface, such as a curved surface.

This embodiment can be combined with Embodiment Modes 1 to 5 and Embodiment 1 to be implemented.

This application is based on Japanese Patent Application serial No. 2005-337912 filed in Japan Patent Office on Nov. 23 in 2005, the entire contents of which are hereby incorporated by reference.

What is claimed is:

1. A method for manufacturing a semiconductor element comprising:
    forming a base film over a glass substrate;
    forming a semiconductor film over the base film;
    forming an oxide film or a nitride film over a surface of the semiconductor film by radical oxidation or radical nitridation of the semiconductor film, at a temperature of the glass substrate lower than a strain point of the glass substrate by 100° C. or more;
    forming a film for preventing oxidation or nitridation of the semiconductor film over the oxide film or the nitride film;
    forming the oxide film or the nitride film and the film for preventing oxidation or nitridation each into a predetermined pattern; and
    performing an element isolation by radical oxidation or radical nitridation of a region of the semiconductor film at a temperature of the glass substrate lower than the strain point of the glass substrate by 100° C. or more,
    wherein the region is not covered with the predetermined pattern, and
    wherein the radical oxidation or the radical nitridation is performed over the semiconductor film placed apart from a plasma generation region in a plasma treatment chamber with an electron temperature of from 0.5 eV to 1.5 eV, and anelectron density of from $1\times10^{11} cm^{-3}$ to $1\times10^{13} cm^{-3}$.

2. A method for manufacturing a semiconductor element comprising:
    forming a base film over a glass substrate;
    forming a semiconductor film over the base film;
    forming an oxide film over a surface of the semiconductor film by radical oxidation of the semiconductor film, at a temperature of the glass substrate lower than a strain point of the glass substrate by 100° C. or more;

forming a tungsten film over the oxide film;

forming the oxide film and the tungsten film each into a predetermined pattern; and performing an element isolation by radical oxidation of a region of the semiconductor film at a temperature of the glass substrate lower than the strain point of the glass substrate by 100° C. or more, wherein the region is not covered with the predetermined pattern, and wherein the radical oxidation is performed over the semiconductor film placed apart from a plasma generation region in a plasma treatment chamber with an electron temperature of from 0.5 eV to 1.5 eV, and an electron density of from $1 \times 10^{11} cm^{-3}$ to $1 \times 10^{13} cm^{-3}$, in which argon, hydrogen, and oxygen are introduced and, among them, a flow ratio $H_2/O_2$ of the hydrogen and the oxygen is from 2 to 4.

* * * * *

UNITED STATES PATENT AND TRADEMARK OFFICE
CERTIFICATE OF CORRECTION

PATENT NO.       : 7,625,783 B2                                        Page 1 of 1
APPLICATION NO. : 11/601193
DATED            : December 1, 2009
INVENTOR(S)      : Satoru Saito It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 403 days.

Signed and Sealed this

Second Day of November, 2010

David J. Kappos
*Director of the United States Patent and Trademark Office*